(12) United States Patent
Cheng et al.

(10) Patent No.: US 10,062,782 B2
(45) Date of Patent: Aug. 28, 2018

(54) METHOD OF MANUFACTURING A SEMICONDUCTOR DEVICE WITH MULTILAYERED CHANNEL STRUCTURE

(71) Applicant: TAIWAN SEMICONDUCTOR MANUFACTURING CO., LTD., Hsinchu (TW)

(72) Inventors: Chao-Ching Cheng, Hsinchu (TW); Chih Chieh Yeh, Taipei (TW); Cheng-Hsien Wu, Hsinchu (TW); Hung-Li Chiang, Taipei (TW); Jung-Piao Chiu, Kaohsiung (TW); Tzu-Chiang Chen, Hsinchu (TW); Tsung-Lin Lee, Hsinchu (TW); Yu-Lin Yang, Hsinchu County (TW); I-Sheng Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/429,861

(22) Filed: Feb. 10, 2017

(65) Prior Publication Data
US 2018/0151717 A1    May 31, 2018

Related U.S. Application Data

(60) Provisional application No. 62/427,720, filed on Nov. 29, 2016.

(51) Int. Cl.
*H01L 29/06* (2006.01)
*H01L 29/78* (2006.01)
(Continued)

(52) U.S. Cl.
CPC ........ *H01L 29/785* (2013.01); *H01L 29/1054* (2013.01); *H01L 29/165* (2013.01); *H01L 29/66795* (2013.01); *H01L 29/7845* (2013.01)

(58) Field of Classification Search
CPC ............. H01L 29/785; H01L 29/66795; H01L 29/7845; H01L 29/1054; H01L 29/165
See application file for complete search history.

(56) References Cited

U.S. PATENT DOCUMENTS 7,425,740 B2  9/2008 Liu et al.
8,048,723 B2  11/2011 Chang et al.
(Continued)

FOREIGN PATENT DOCUMENTS

| DE | 102005045078 A1 | 9/2006 |
|---|---|---|
| KR | 10-2006-0028575 A | 3/2006 |
| KR | 10-2016-0076423 A | 6/2016 |

OTHER PUBLICATIONS

Office Action issued in corresponding German Application No. 10 2017 103 674.1 dated Nov. 10, 2017.
(Continued)

*Primary Examiner* — Cuong B Nguyen
(74) *Attorney, Agent, or Firm* — McDermott Will & Emery LLP

(57) ABSTRACT

A semiconductor device includes a fin field effect transistor (FinFET). The FinFET includes a channel disposed on a fin, a gate disposed over the channel and a source and drain. The channel includes at least two pairs of a first semiconductor layer and a second semiconductor layer formed on the first semiconductor layer. The first semiconductor layer has a different lattice constant than the second semiconductor layer. A thickness of the first semiconductor layer is three to ten times a thickness of the second semiconductor layer at least in one pair.

20 Claims, 41 Drawing Sheets

(51) Int. Cl.
  *H01L 29/10* (2006.01)
  *H01L 29/165* (2006.01)
  *H01L 29/66* (2006.01)

(56) References Cited

U.S. PATENT DOCUMENTS

| | | |
|---|---|---|
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2006/0076625 A1* | 4/2006 | Lee ............... H01L 29/7851 257/353 |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2015/0243733 A1 | 8/2015 | Yang et al. |
| 2015/0263003 A1 | 9/2015 | Lee et al. |
| 2015/0364594 A1 | 12/2015 | Lu |
| 2016/0155800 A1 | 6/2016 | Zang et al. |
| 2016/0181414 A1 | 6/2016 | Huang et al. |
| 2016/0204195 A1 | 7/2016 | Wen et al. |
| 2016/0308055 A1 | 10/2016 | Obradovic et al. |
| 2017/0243957 A1* | 8/2017 | Lo ............... H01L 29/66795 |

OTHER PUBLICATIONS

Korean Office Action issued in corresponding Korean Application No. 10-2017-0062531, dated Apr. 23, 2018.

* cited by examiner

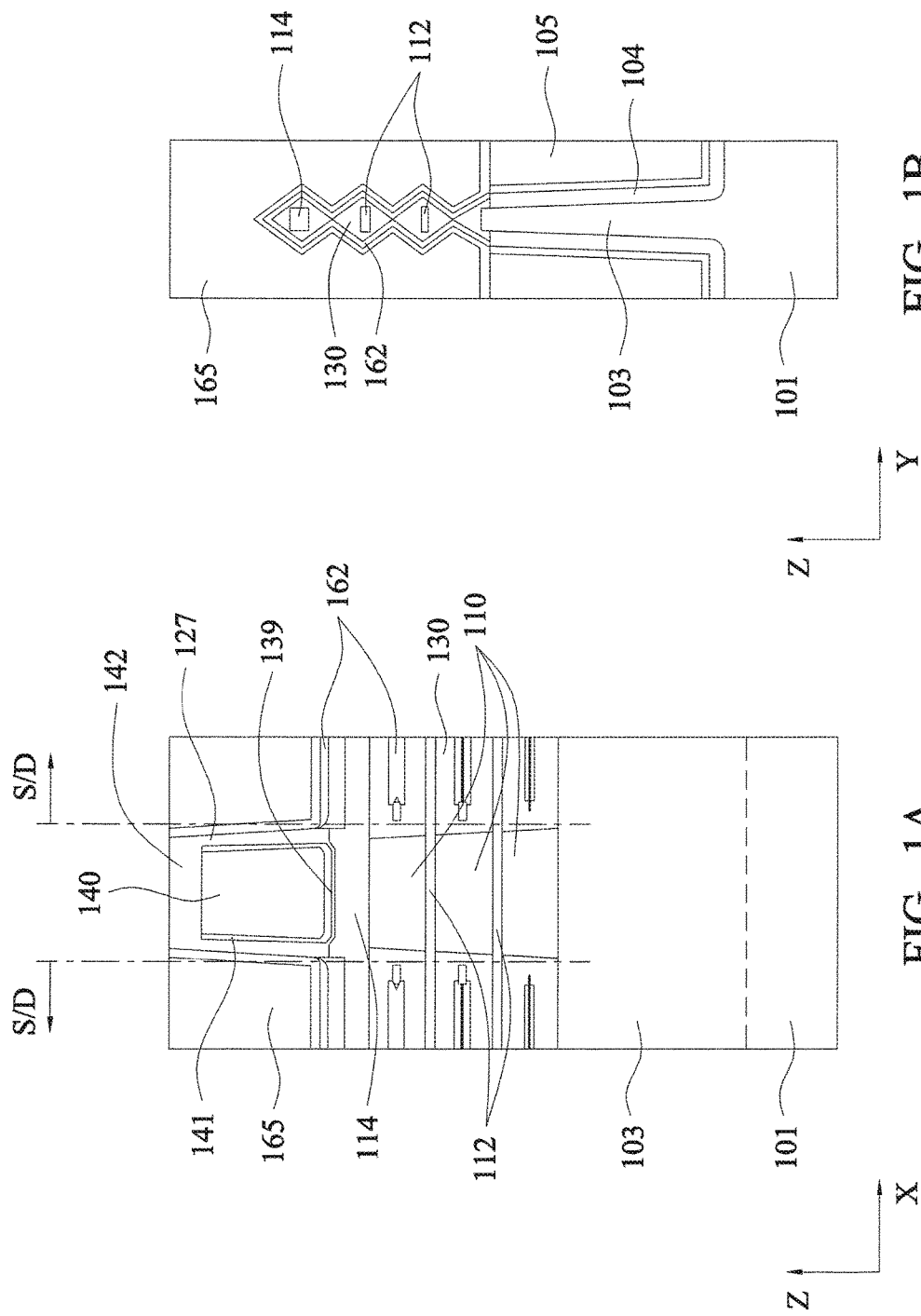

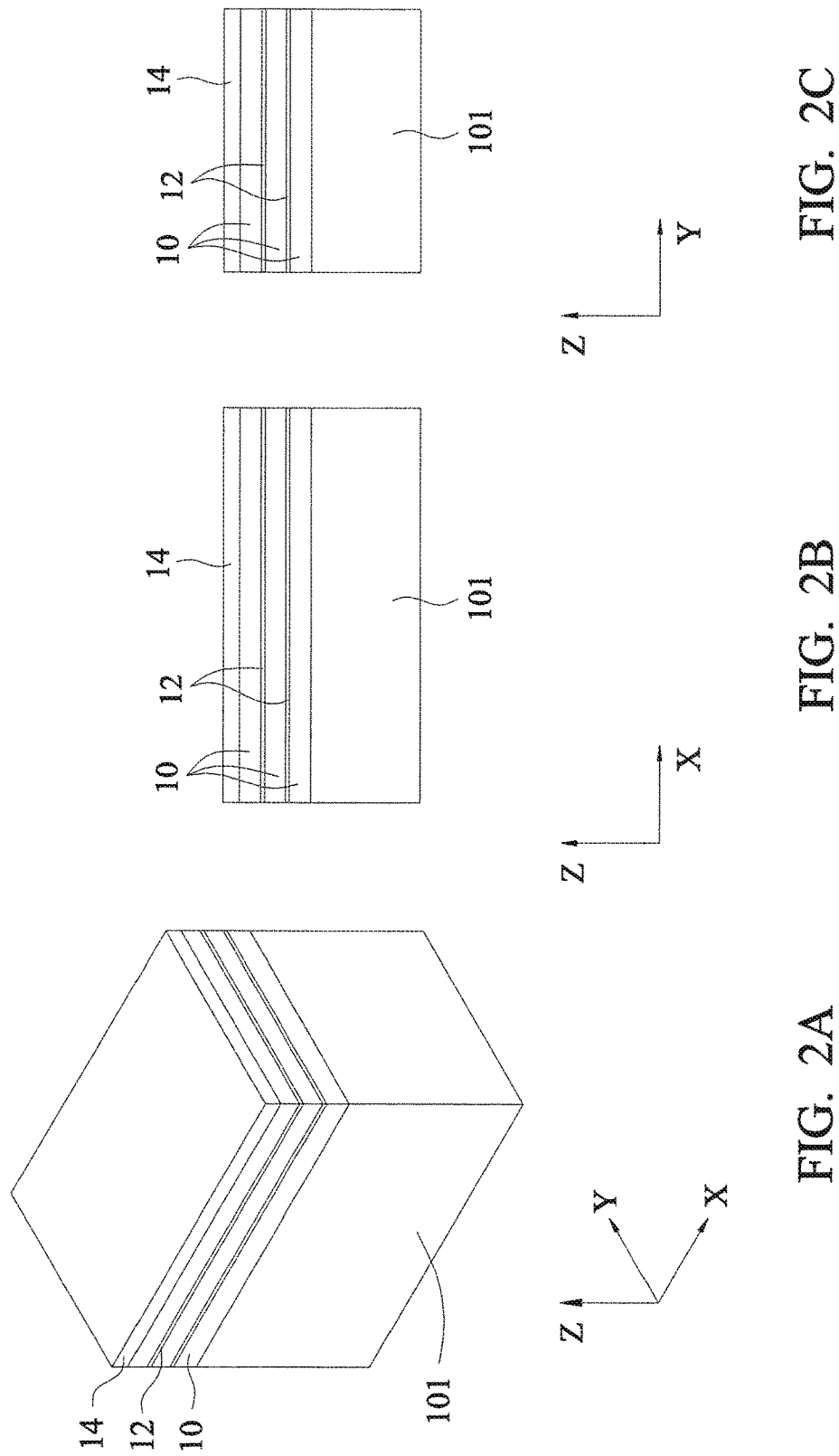

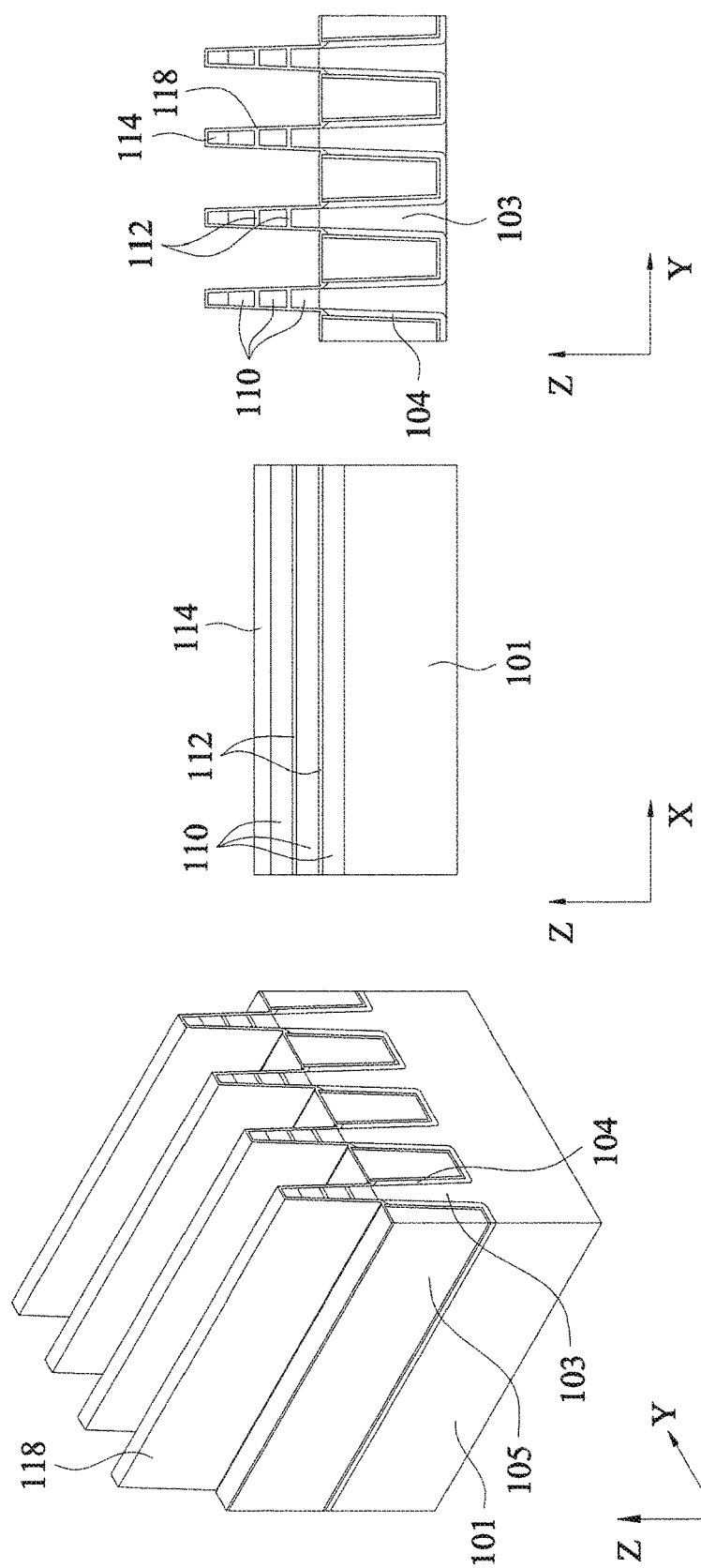

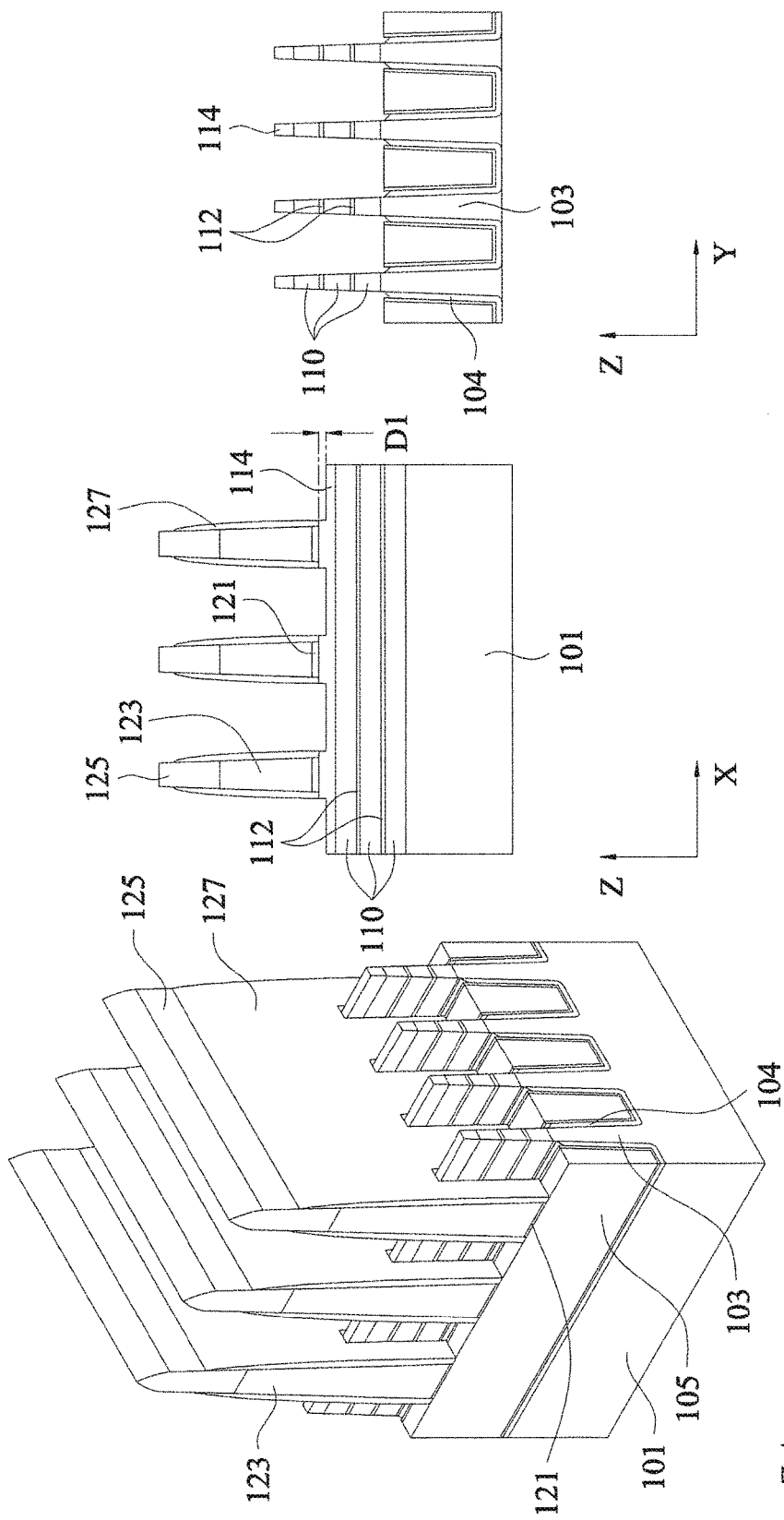

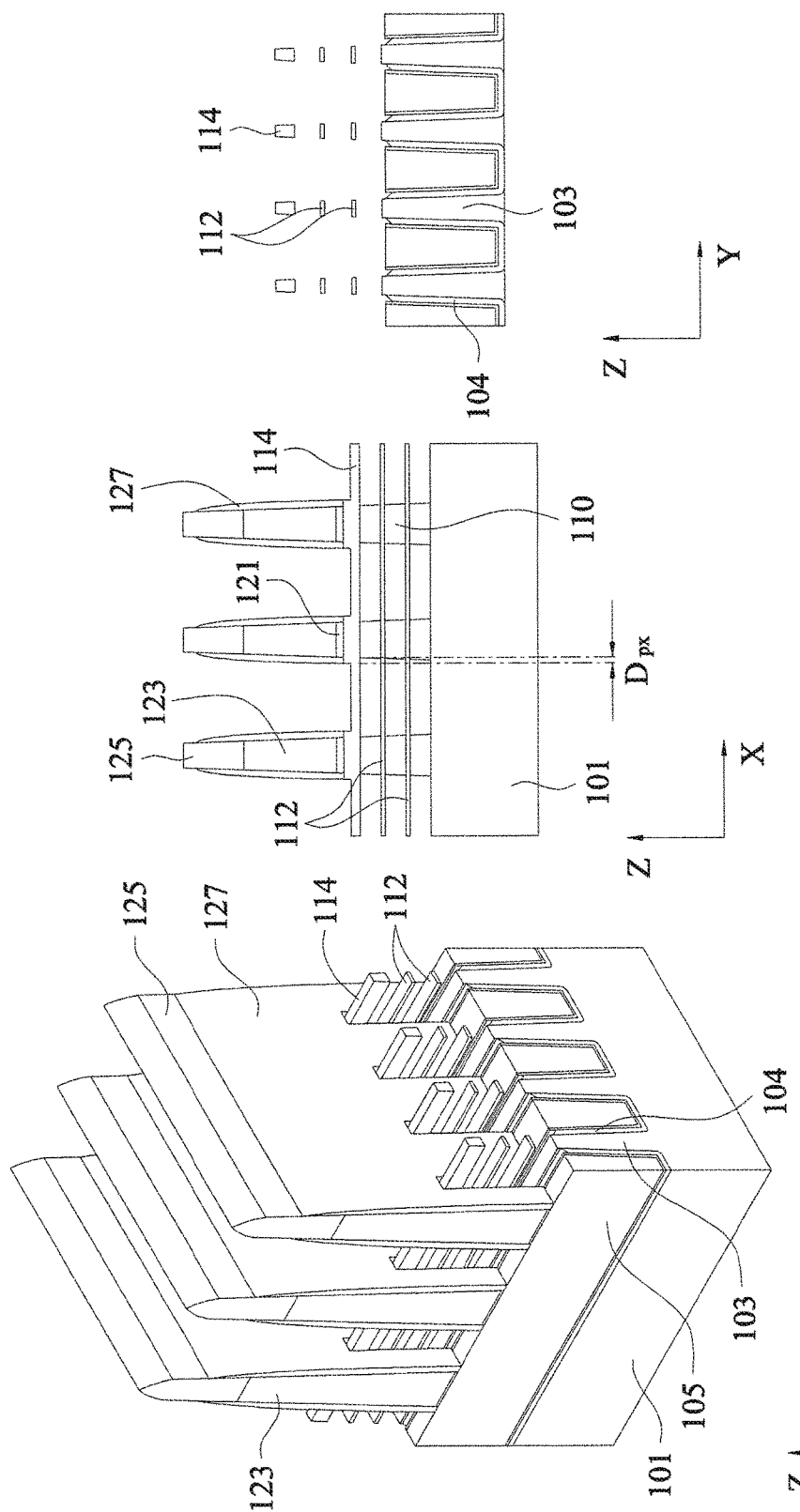

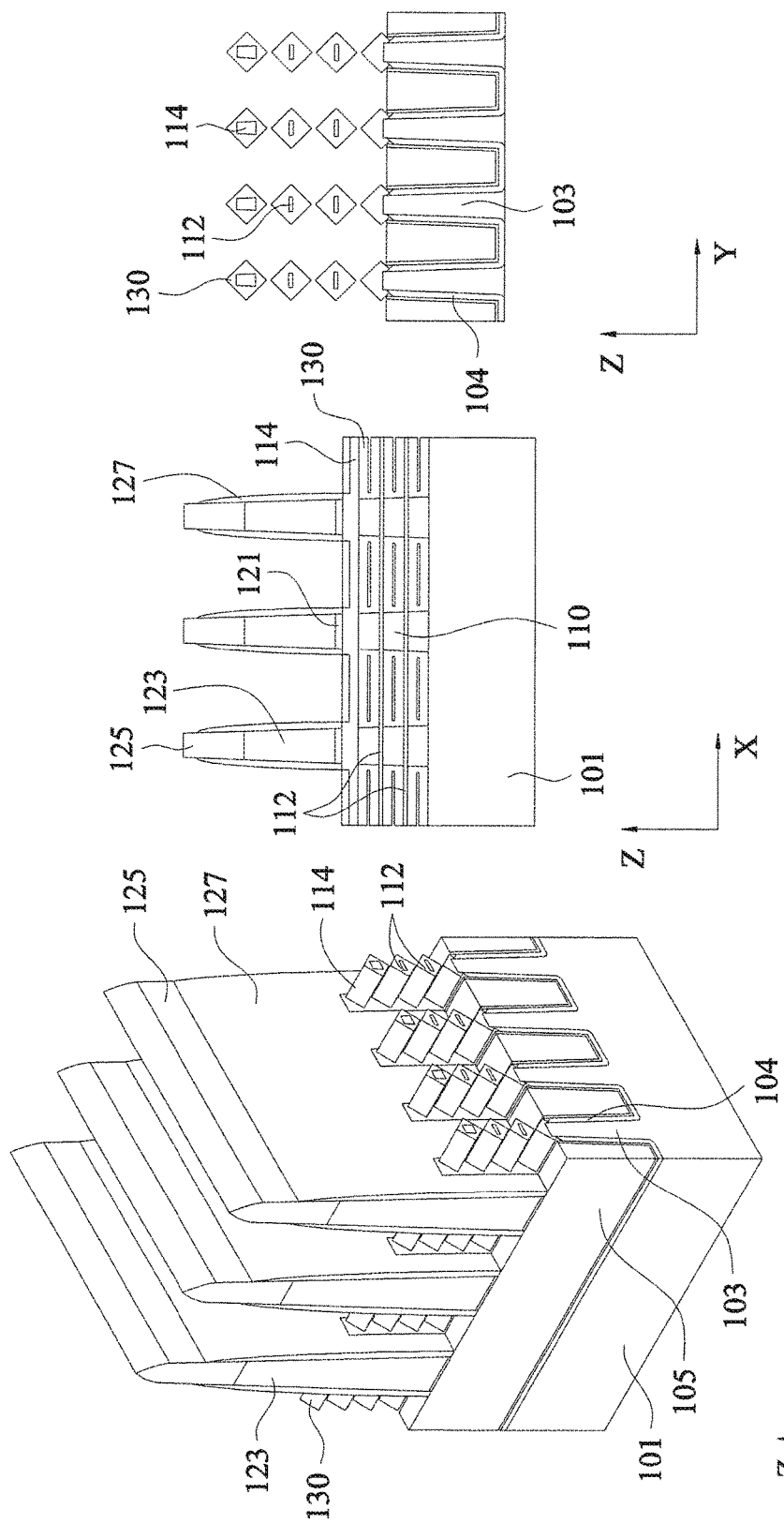

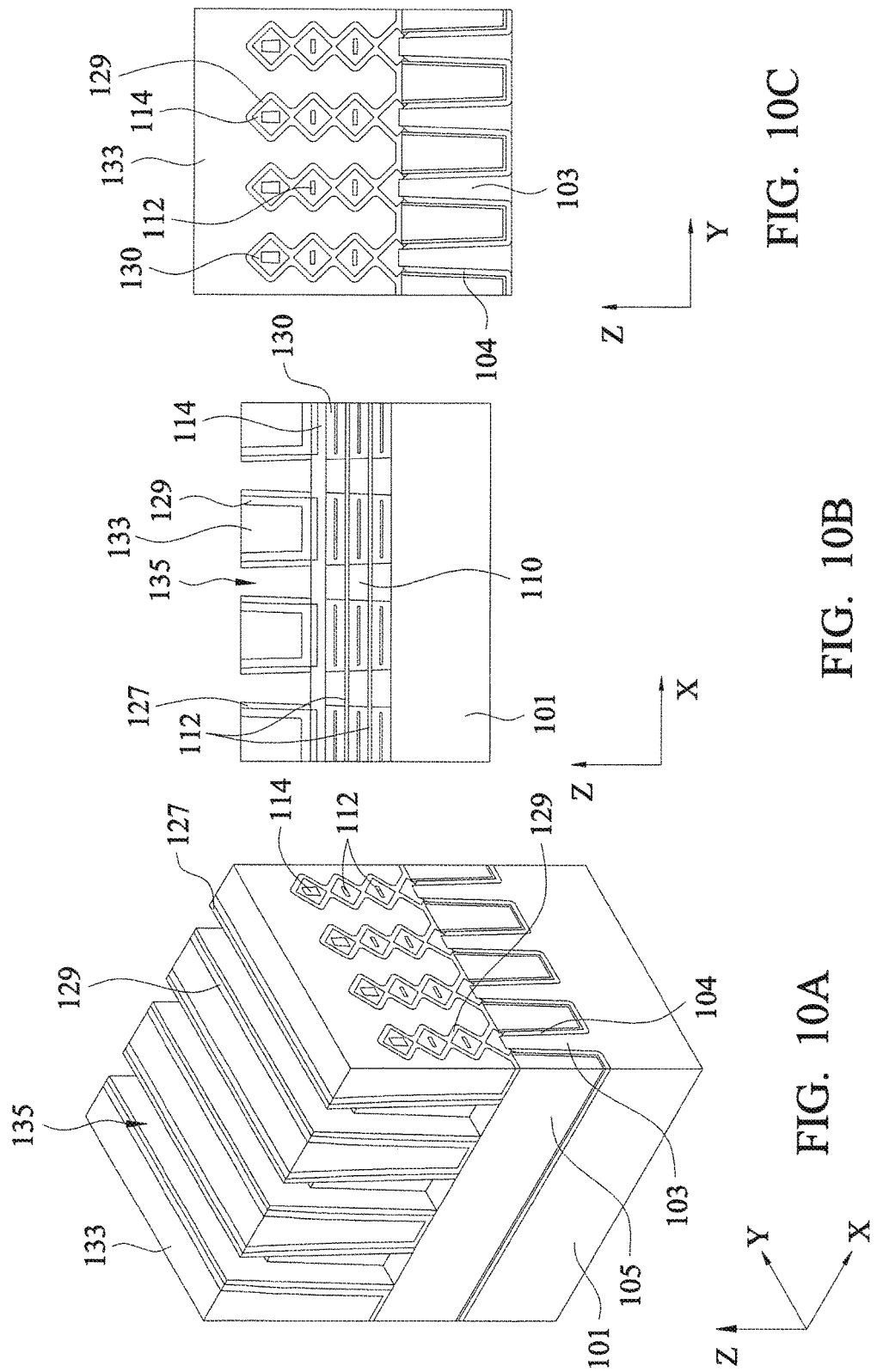

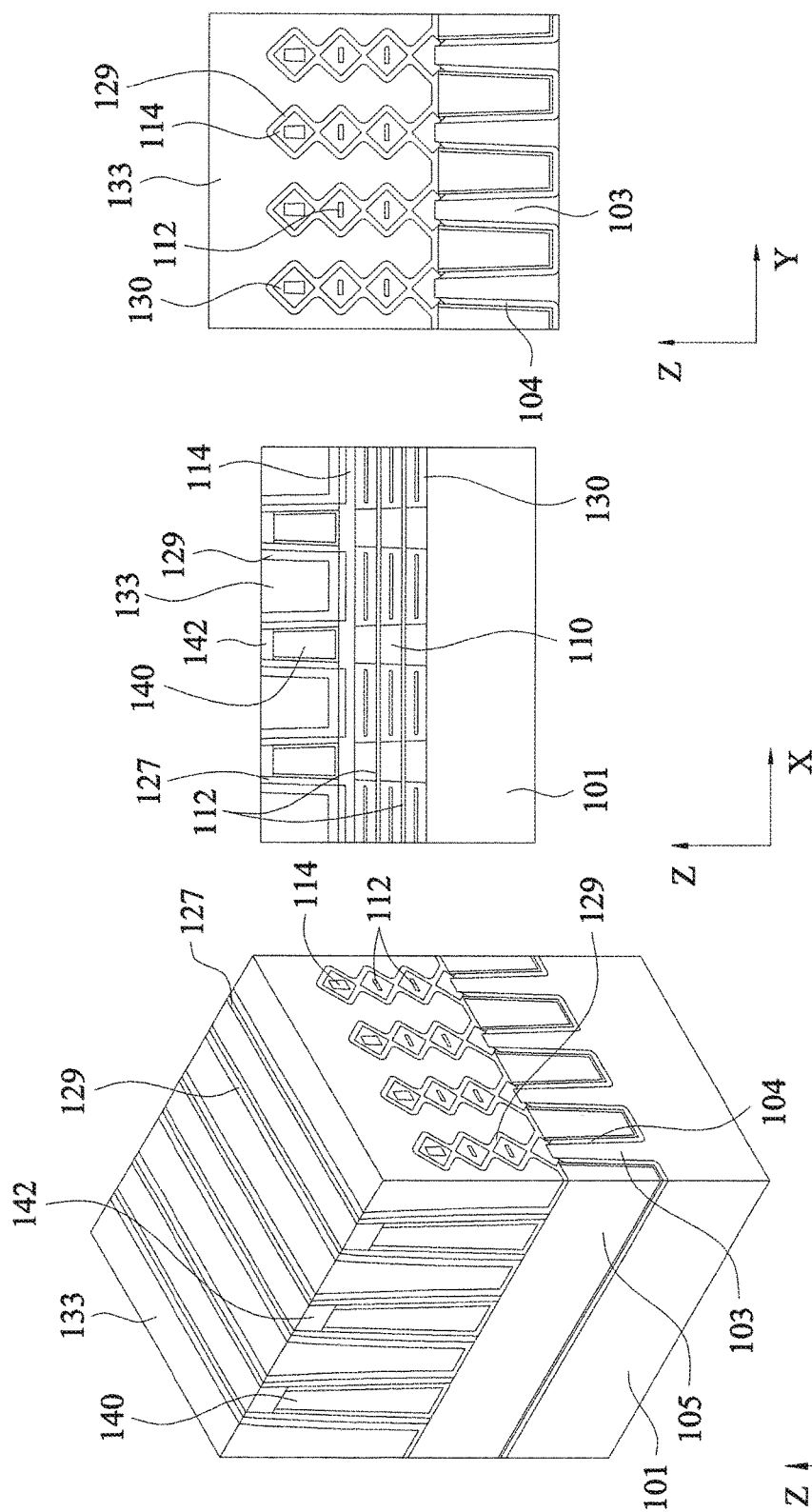

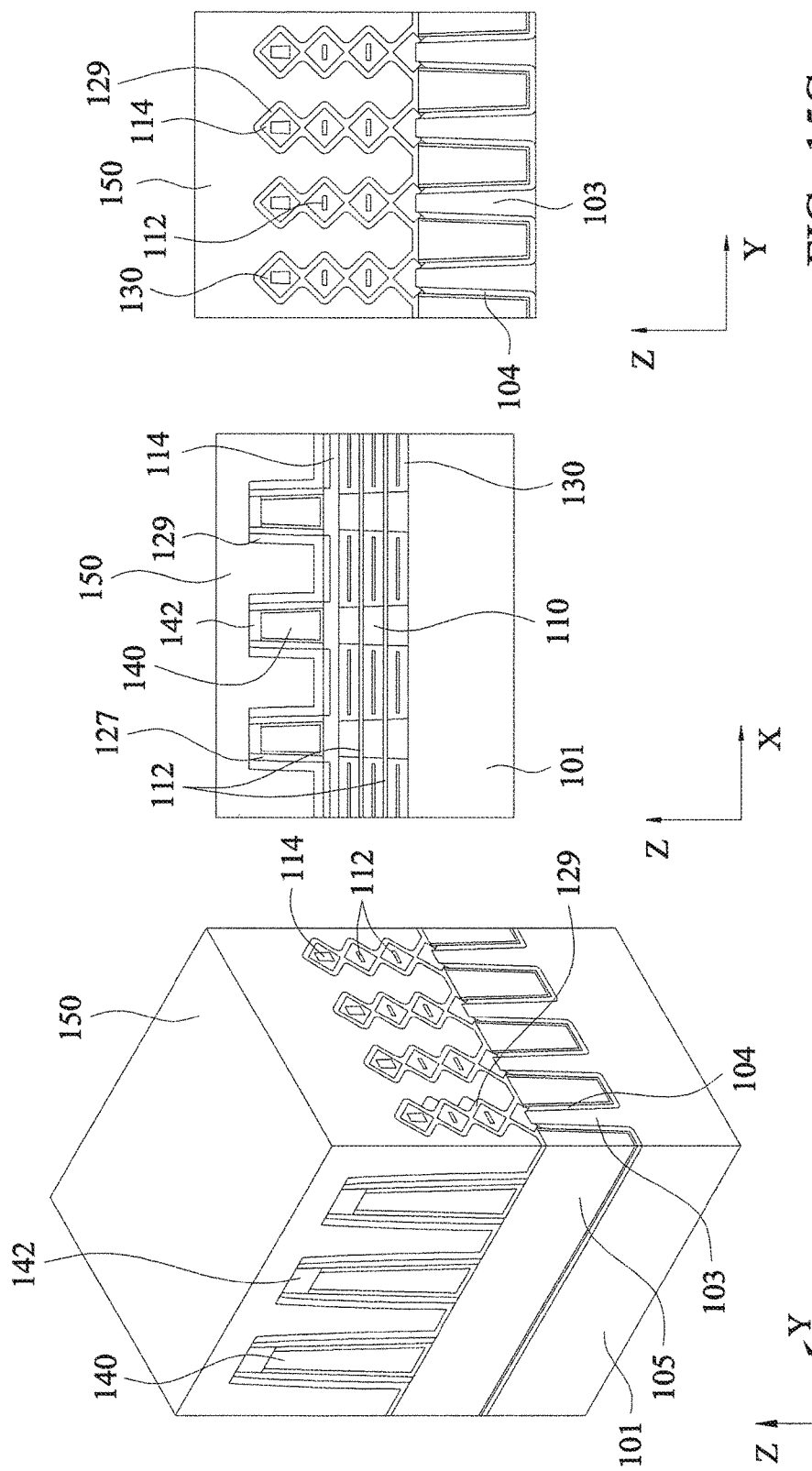

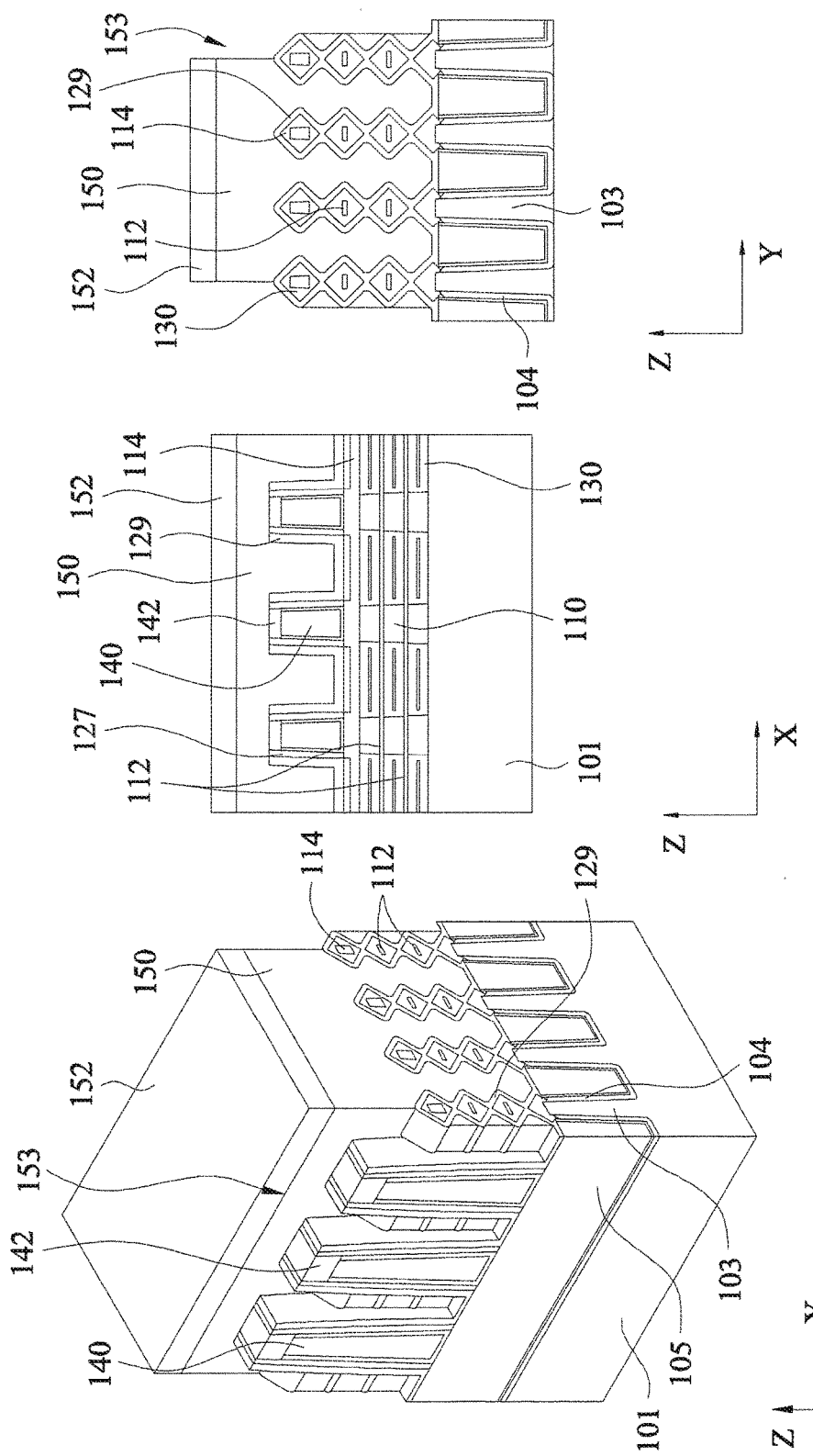

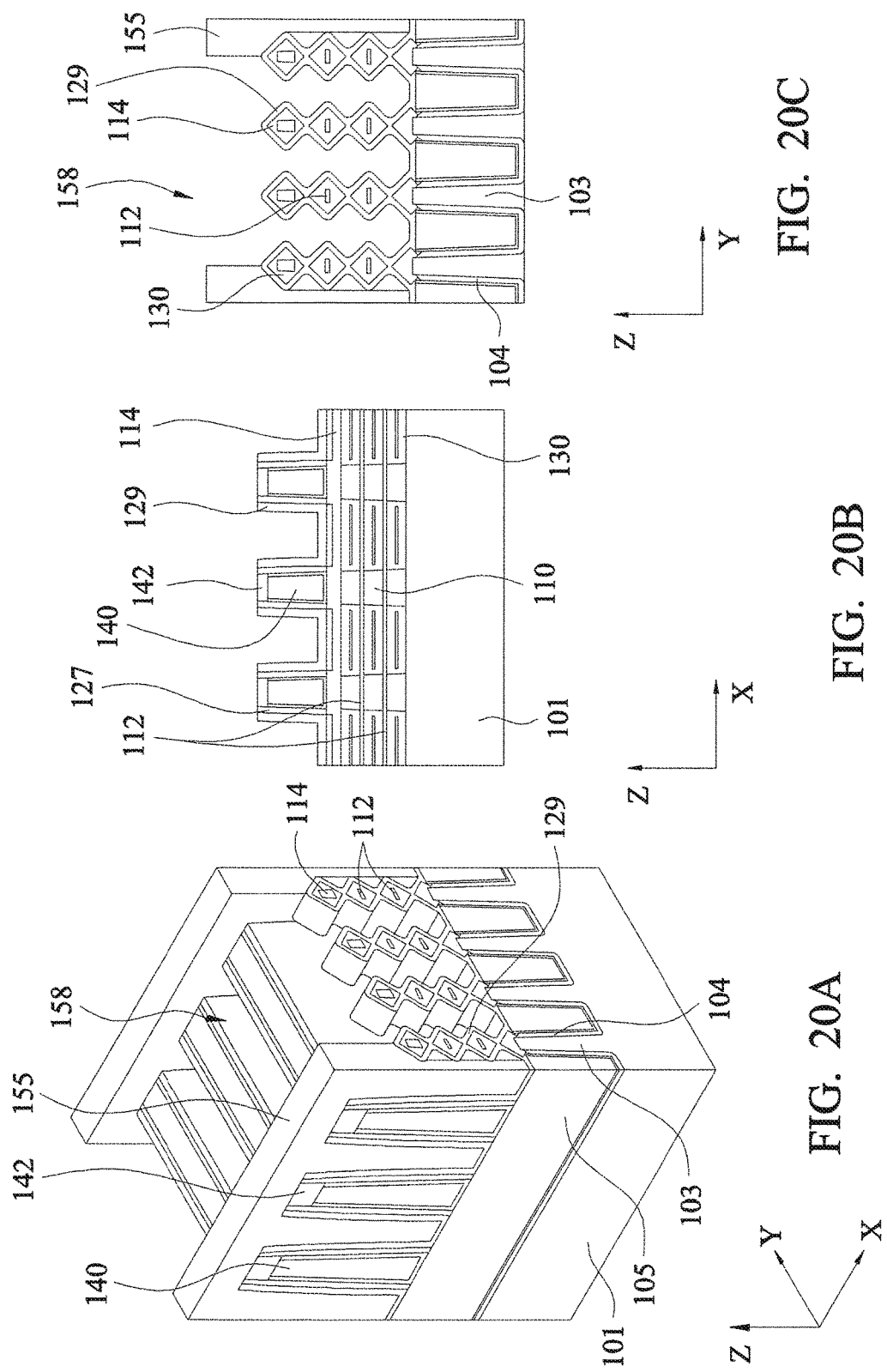

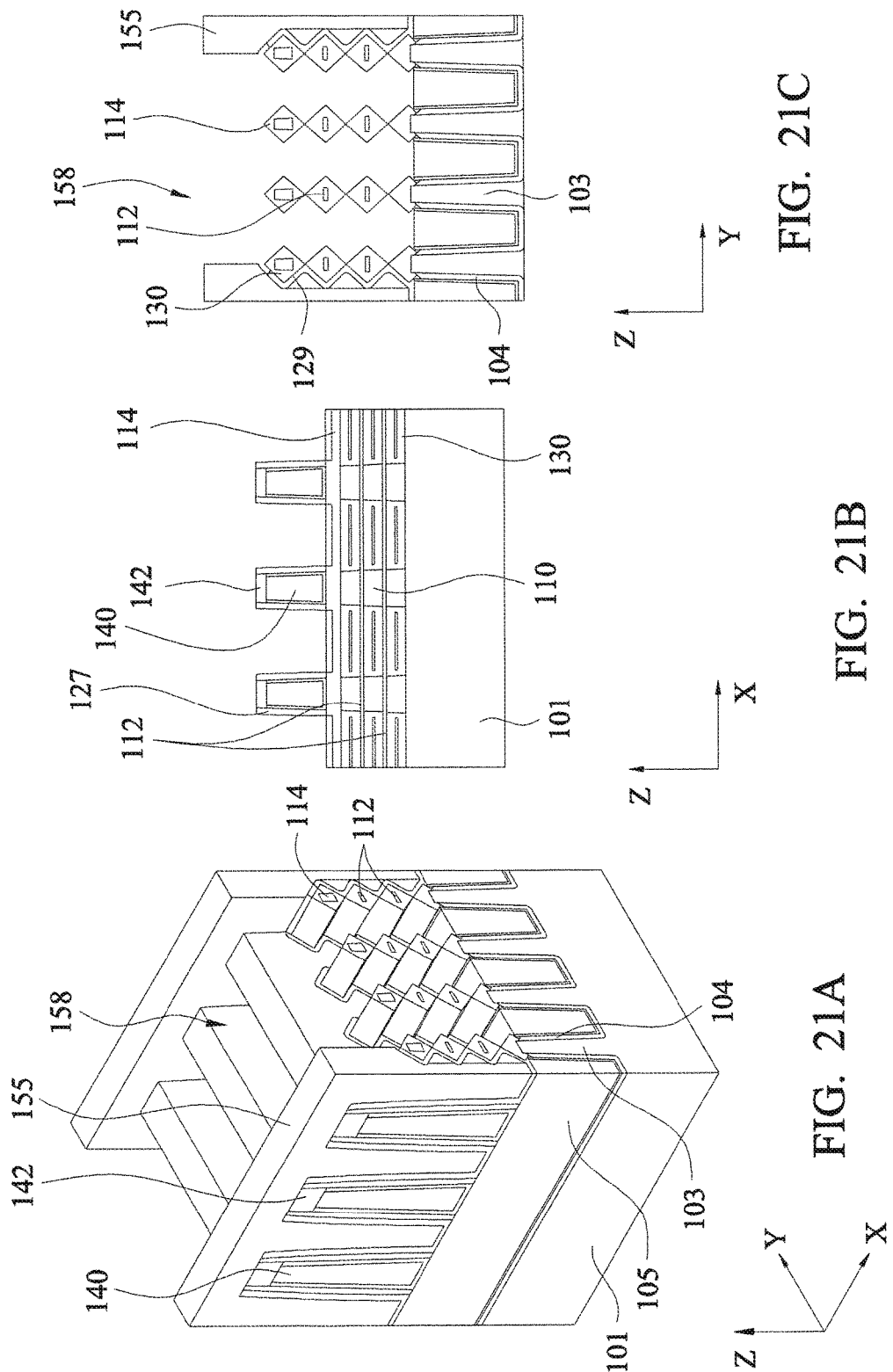

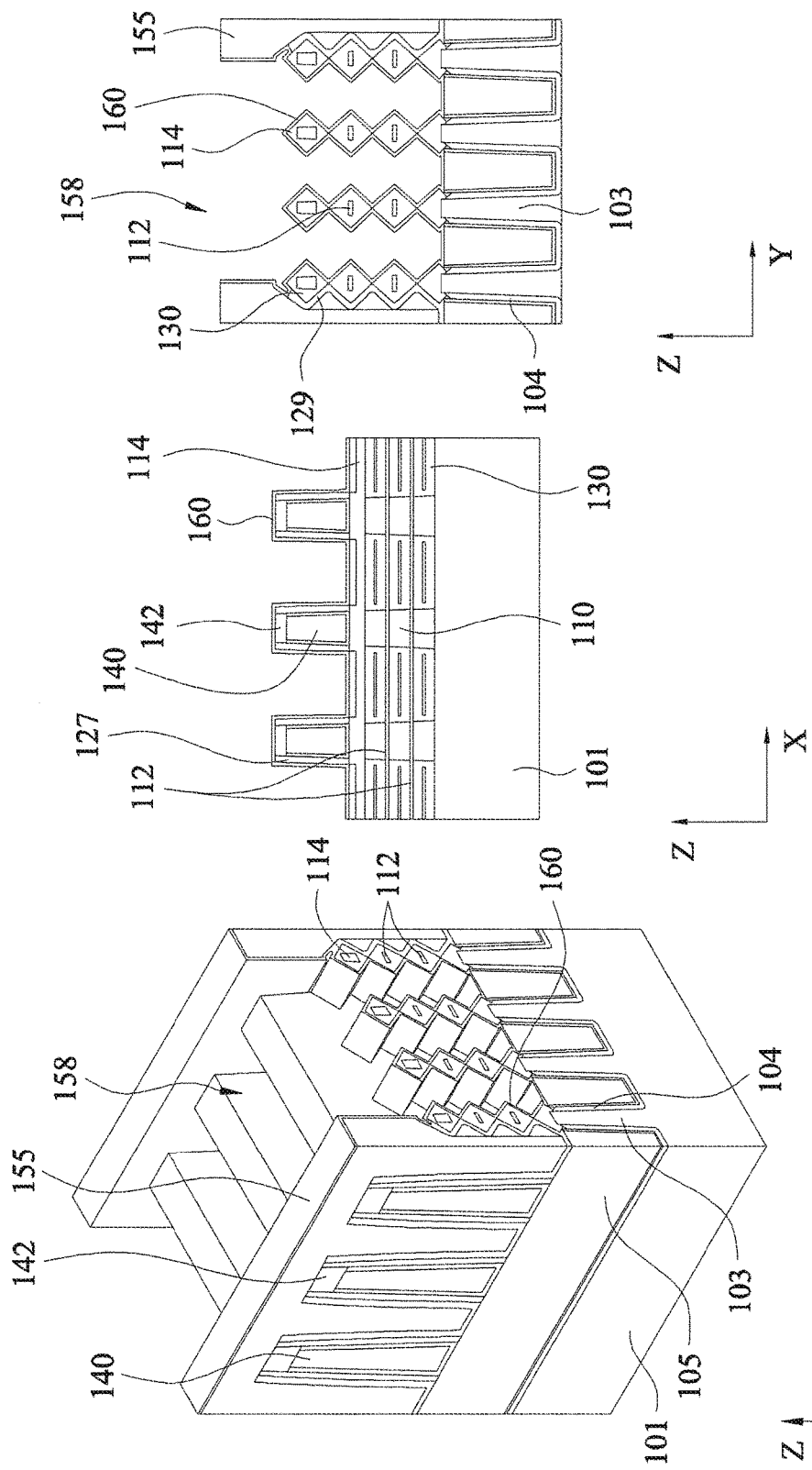

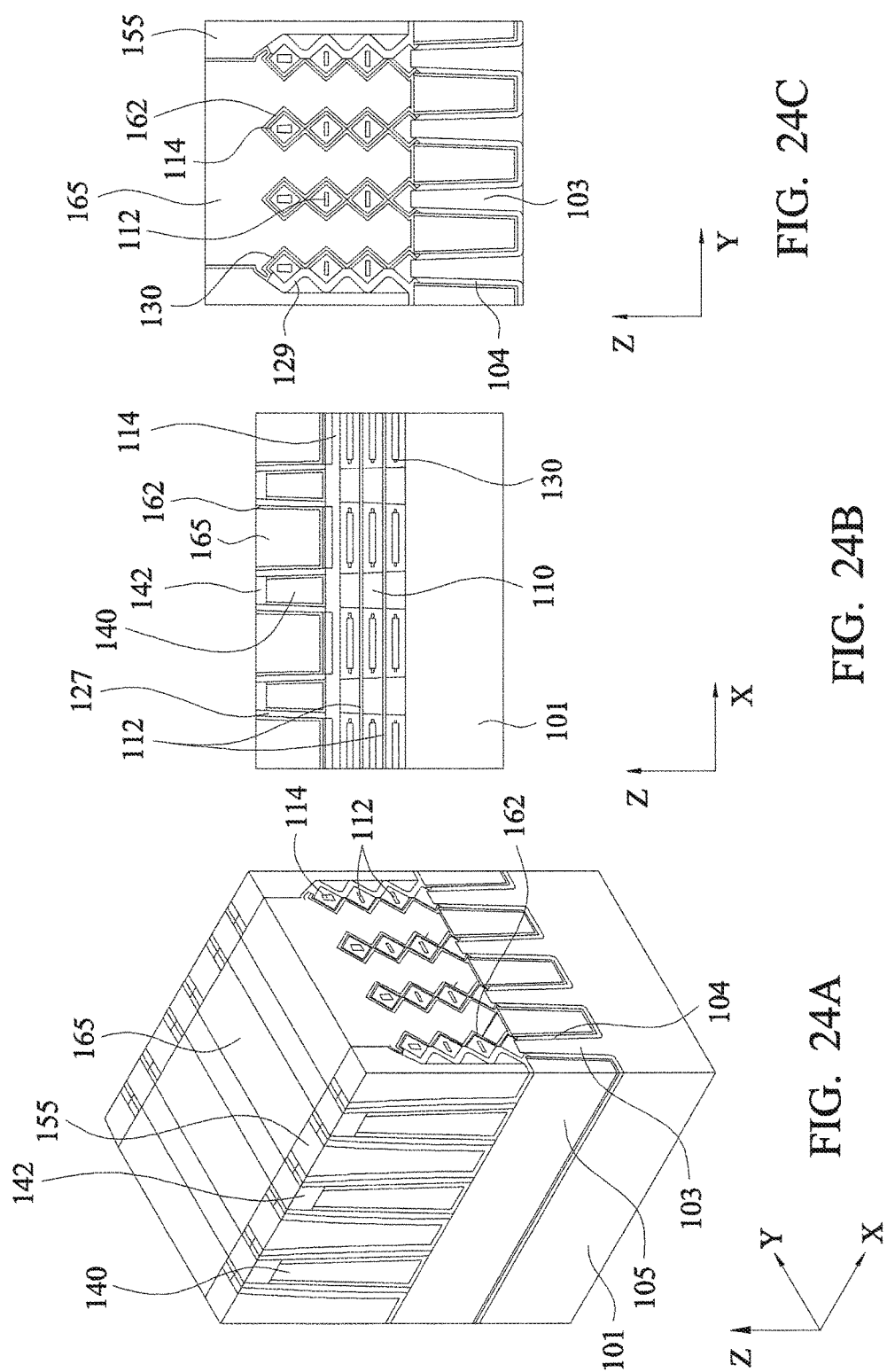

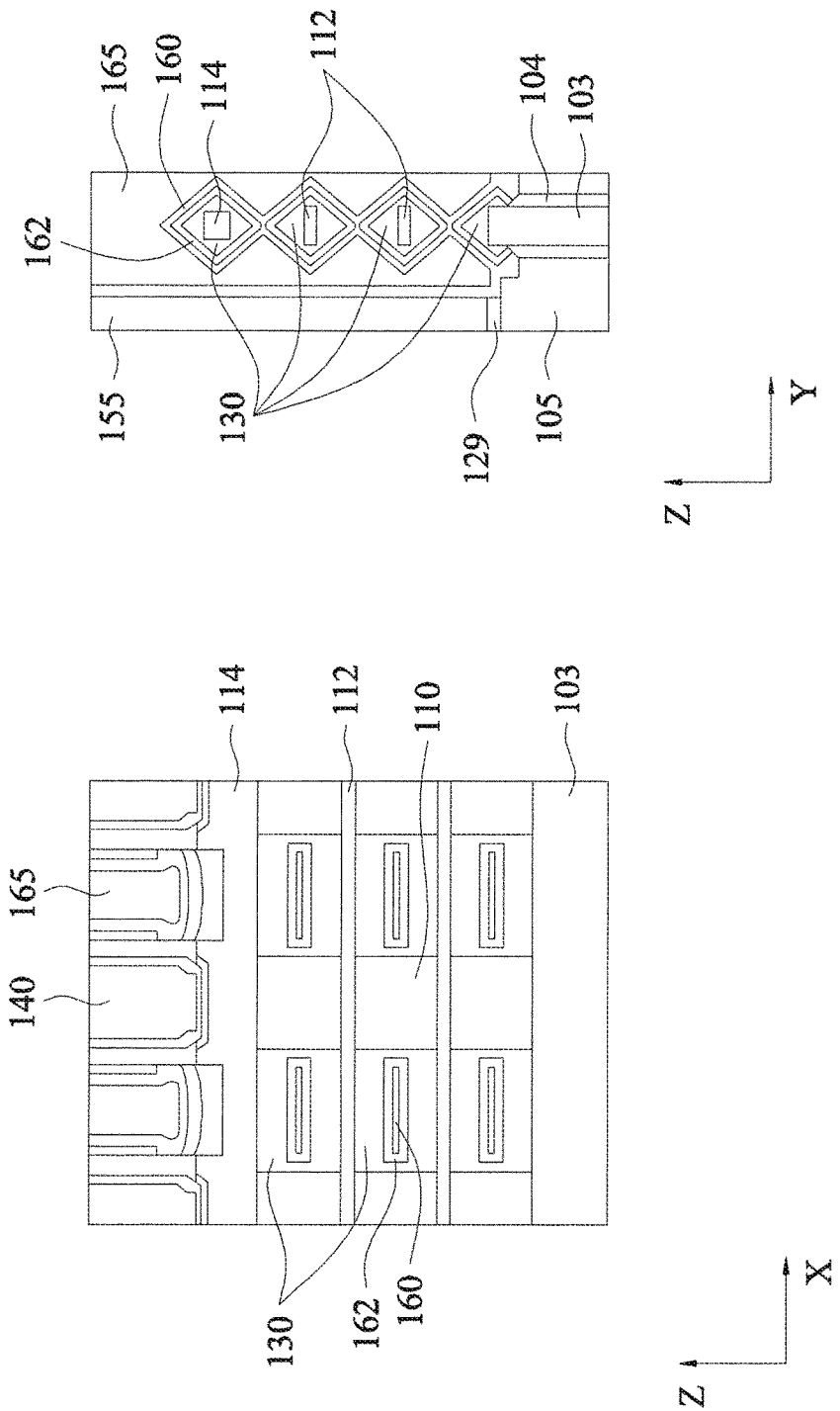

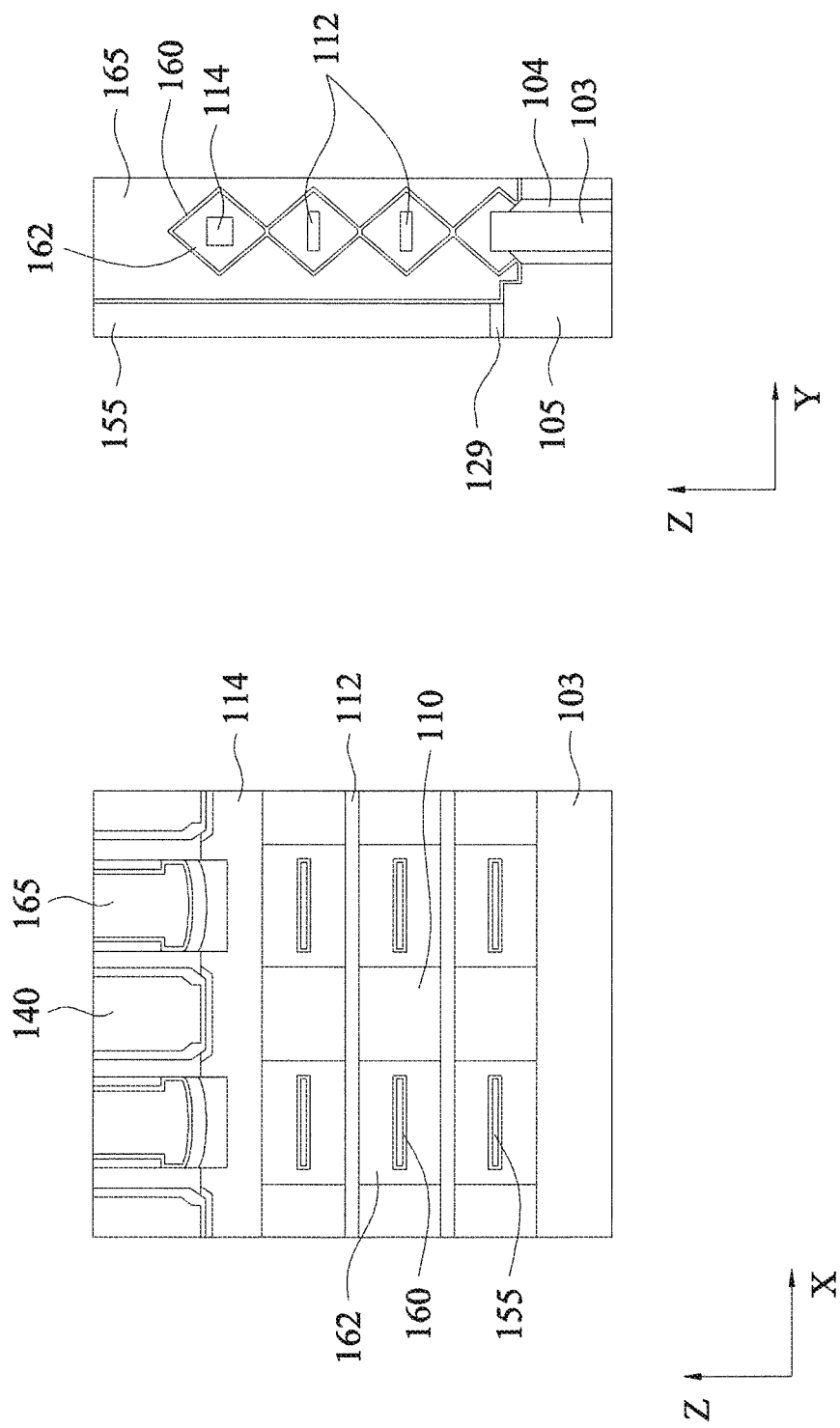

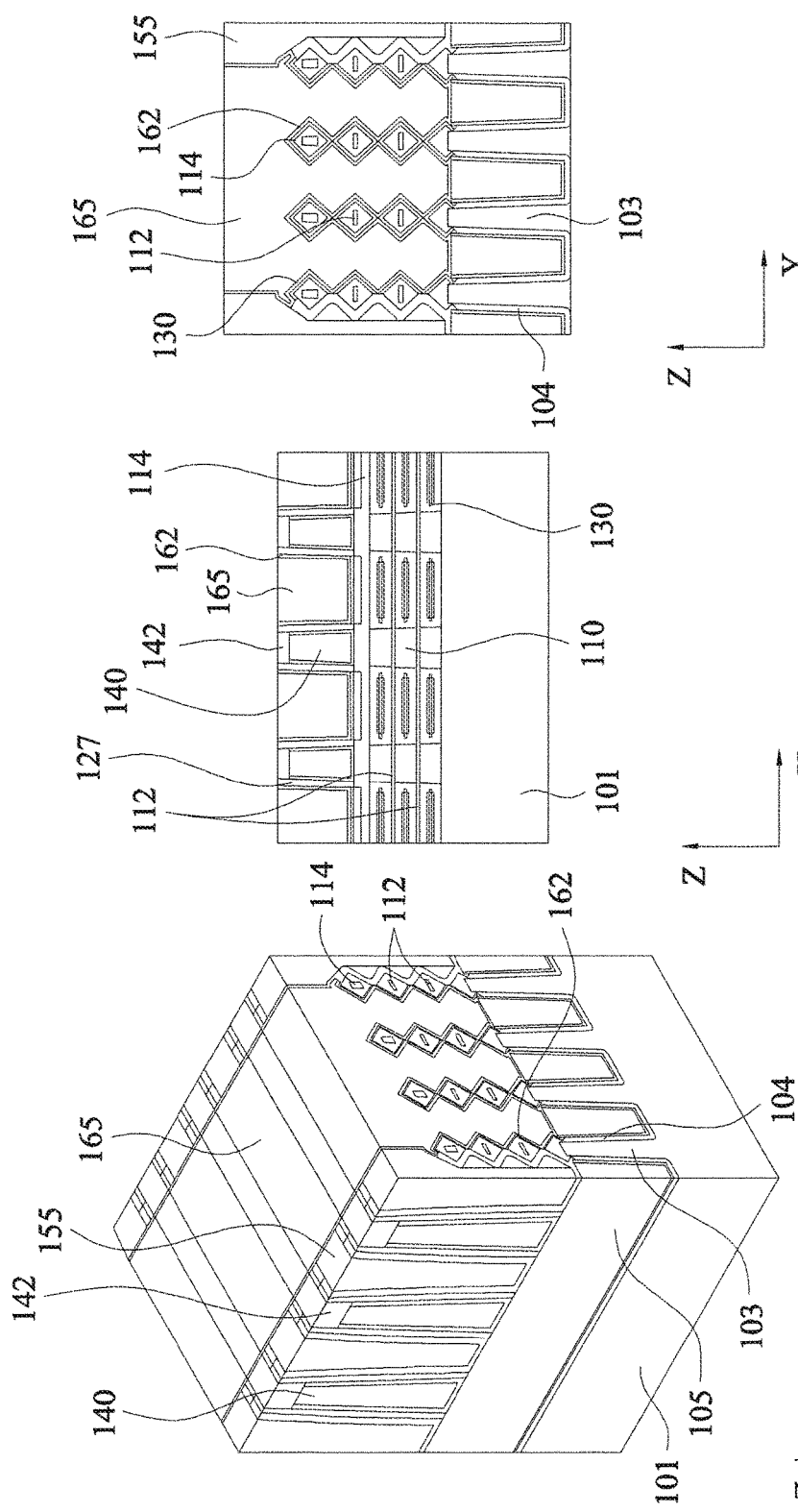

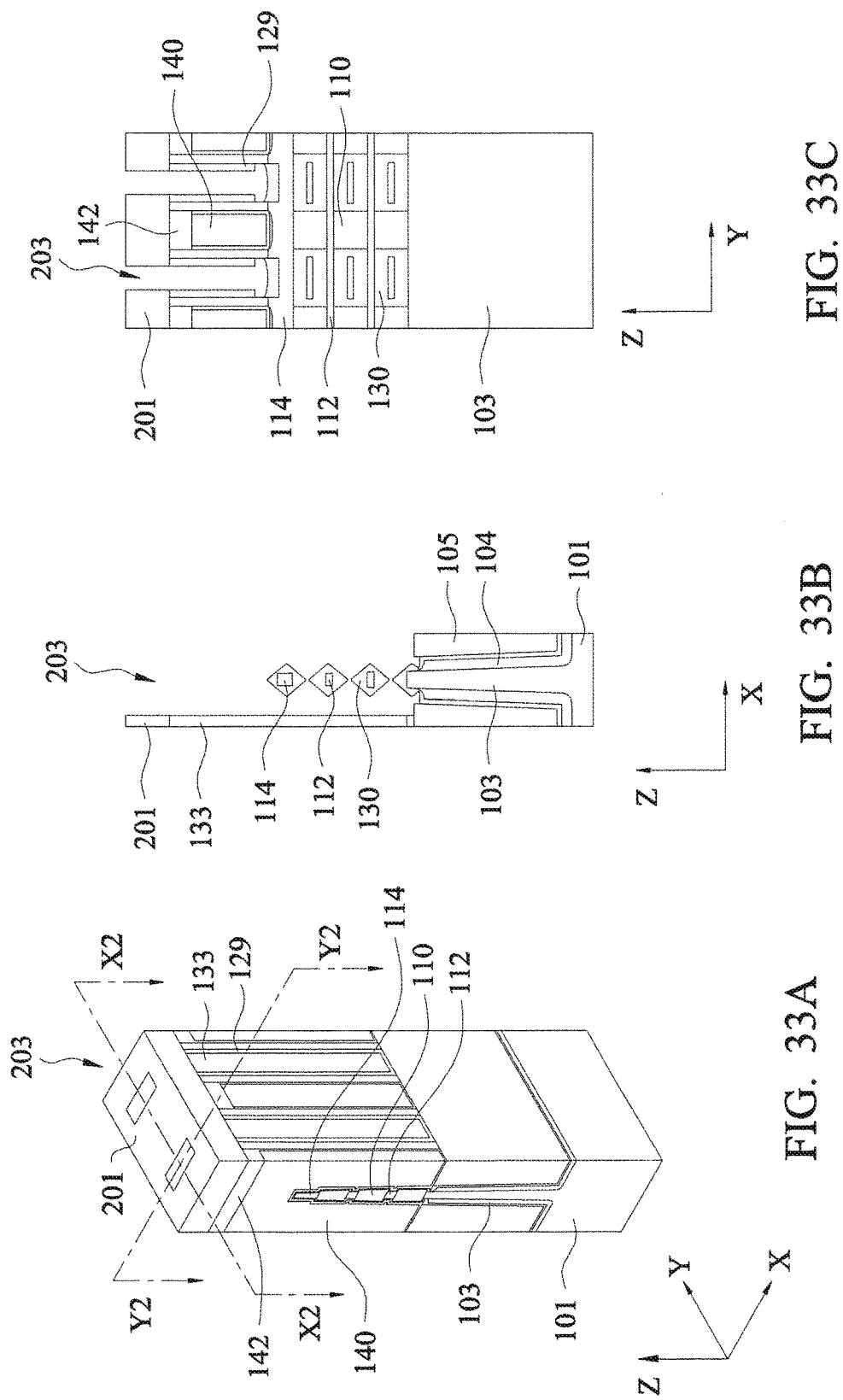

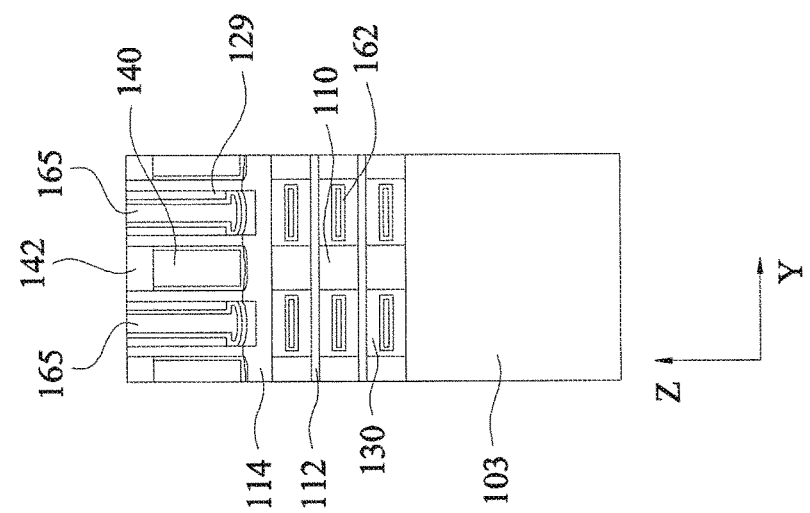
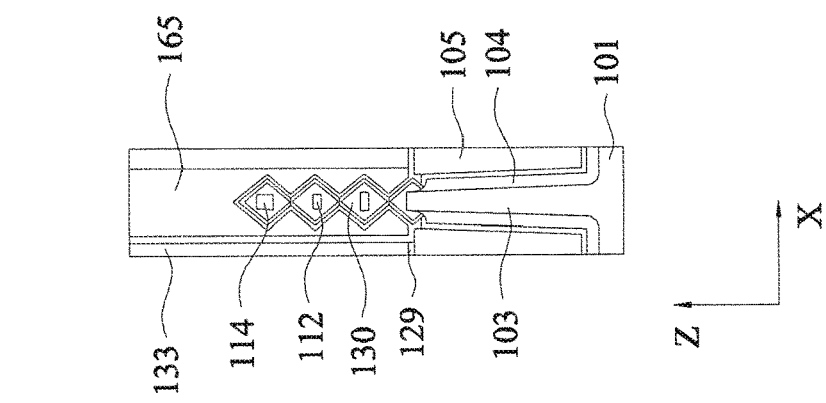
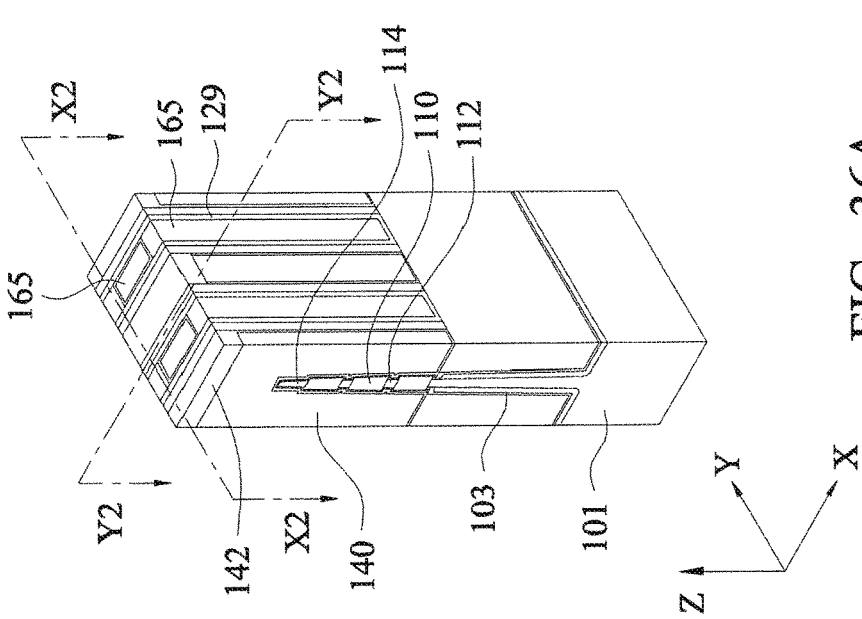
FIG. 36C
FIG. 36B
FIG. 36A

METHOD OF MANUFACTURING A SEMICONDUCTOR DEVICE WITH MULTILAYERED CHANNEL STRUCTURE

CROSS-REFERENCE TO RELATED APPLICATIONS

This application claims priority to U.S. Provisional Patent Application 62/427,720 filed Nov. 29, 2016, the entire disclosure of which is incorporated herein by reference.

TECHNICAL FIELD

The disclosure relates to method of manufacturing semiconductor integrated circuits, and more particularly to method of manufacturing semiconductor devices including fin field effect transistors (FinFETs), and semiconductor devices.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1D illustrate exemplary cross sectional views of a fin field effect transistor (FinFET) according to some embodiments of the present disclosure.

FIGS. 2A-2C illustrate one of the various process stages in a semiconductor device fabrication process according to some embodiments of the present disclosure.

FIGS. 4A-4C illustrate one of the various process stages in a semiconductor device fabrication process according to some embodiments of the present disclosure.

FIGS. 6A-6C illustrate one of the various process stages in a semiconductor device fabrication process according to some embodiments of the present disclosure.

FIGS. 7A-7C illustrate one of the various process stages in a semiconductor device fabrication process according to some embodiments of the present disclosure.

FIGS. 8A-8E illustrate one of the various process stages in a semiconductor device fabrication process according to some embodiments of the present disclosure.

FIGS. 10A-10C illustrate one of the various process stages in a semiconductor device fabrication process according to some embodiments of the present disclosure.

FIGS. 13A-13C illustrate one of the various process stages in a semiconductor device fabrication process according to some embodiments of the present disclosure.

FIGS. 15A-15C illustrate one of the various process stages in a semiconductor device fabrication process according to some embodiments of the present disclosure.

FIGS. 18A-18C illustrate one of the various process stages in a semiconductor device fabrication process according to some embodiments of the present disclosure.

FIGS. 20A-20C illustrate one of the various process stages in a semiconductor device fabrication process according to some embodiments of the present disclosure.

FIGS. 21A-21C illustrate one of the various process stages in a semiconductor device fabrication process according to some embodiments of the present disclosure.

FIGS. 22A-22D illustrate one of the various process stages in a semiconductor device fabrication process according to some embodiments of the present disclosure.

FIGS. 24A-24C illustrate one of the various process stages in a semiconductor device fabrication process according to some embodiments of the present disclosure.

FIGS. 25A and 25B illustrate exemplary cross sectional views of a fin field effect transistor (FinFET) according to some embodiments of the present disclosure.

FIGS. 30A and 30B illustrate exemplary cross sectional views of a FinFET according to some embodiments of the present disclosure.

FIGS. 31A-31C illustrate exemplary views of a FinFET according to other embodiments of the present disclosure.

FIGS. 33A-33C illustrate one of the various process stages in a semiconductor device fabrication process according to some embodiments of the present disclosure.

FIGS. 36A-36C illustrate one of the various process stages in a semiconductor device fabrication process according to some embodiments of the present disclosure.

DETAILED DESCRIPTION

Figure 1C:
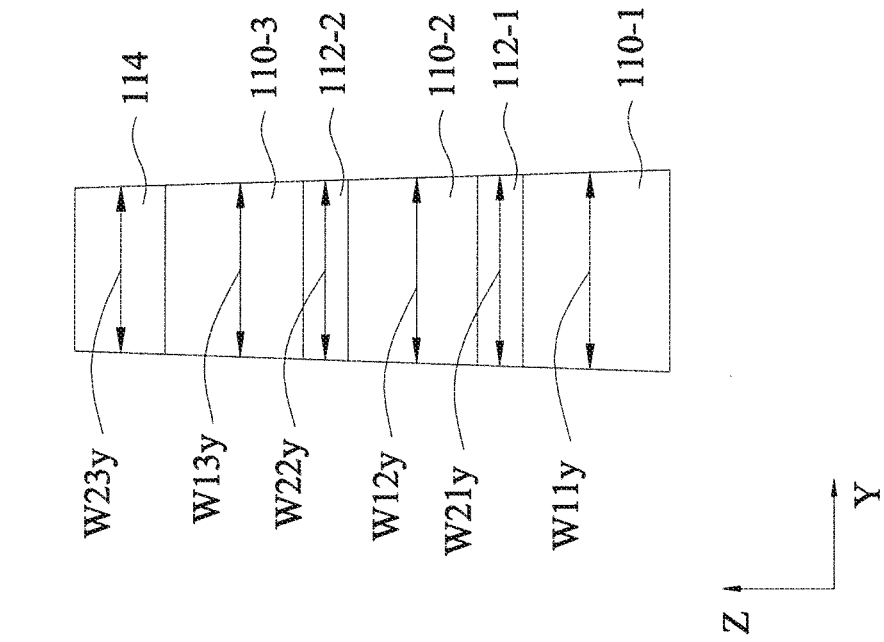

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Silicon germanium ($Si_{1-x}Ge_x$), which hereinafter may be referred to as SiGe, has been employed as a channel material for a FinFET and is typically epitaxially formed on a Si layer. Further, based on different lattice constants between Si and SiGe, a stress (strain) is applied to the SiGe channel, which can increase carrier mobility. However, due to a lattice mismatch between the Si layer and the SiGe layer, there is a critical thickness of the epitaxially grown SiGe without generating defects and/or relaxing the stress. The critical thickness decreases with increase of a Ge content x in SiGe. For example, when x=0.3, the critical thickness is about 52 nm. Generally, a higher channel height is advantageous to increase a current density. However, the higher SiGe epitaxial channel layer tends to lose the strain in the channel layer.

To maintain the stress and to increase the channel height, in the present disclosure, one or more beam-like channel layers made of, for example, Si, are inserted within main channel layers made of for example, SiGe, to maintain the channel strain maintenance and to increase the channel height of the main channel layers.

Figure 1D:
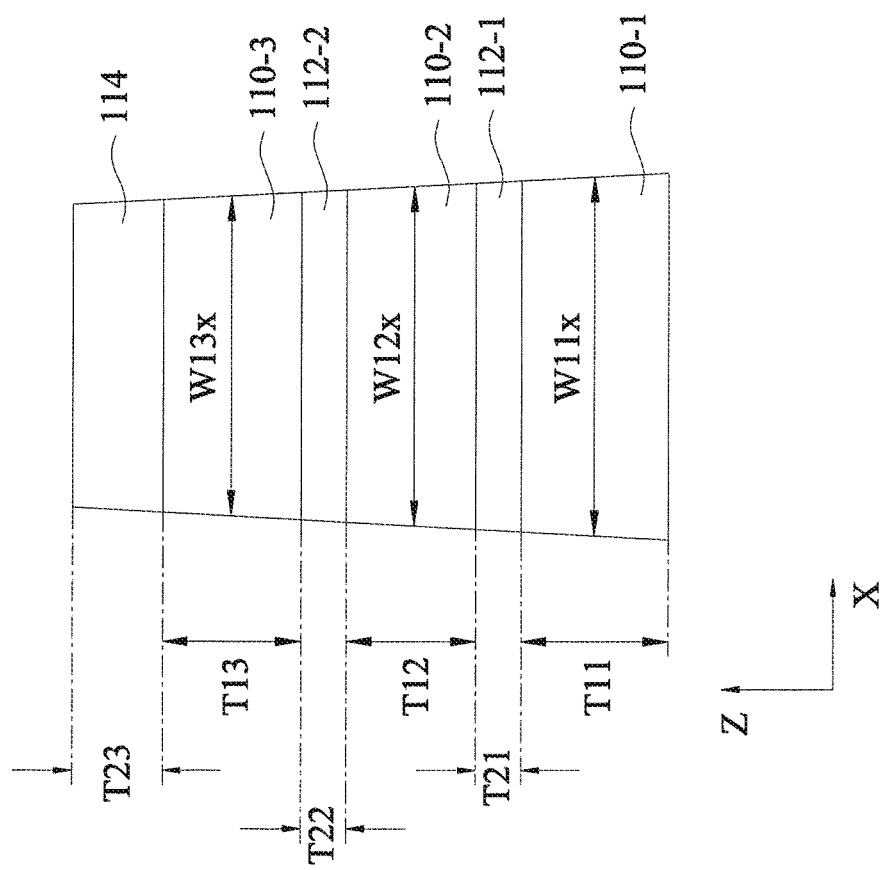

FIGS. 1A-1D illustrate exemplary cross sectional views of a fin field effect transistor (FinFET) according to some embodiments of the present disclosure. FIG. 1A shows an exemplary cross sectional view along the channel direction (X direction) cutting a gate and a channel, FIG. 1B shows an exemplary cross sectional view along the Y direction cutting a fin and a source/drain region, and FIG. 1C is an enlarged view of the channel of FIG. 1A. FIG. 1D is a cross sectional view of the channel layer along Y direction.

As shown in FIGS. 1A and 1B, a base fin structure 103 is disposed over a substrate 101. The side walls of the base fin and the upper surface of the substrate are covered by a liner layer 104. Further, an isolation insulating layer 105, which is also referred to as shallow trench isolation (STI), is disposed over the liner layer 104. In some embodiments, the substrate 101 and the base fin structure 103 are made of Si, the liner layer 104 is made of silicon oxide and/or SiN (silicon nitride), and the isolation insulating layer 105 is made of silicon oxide.

The FinFET further include a gate dielectric layer 139 disposed over a channel fin structure (see below), a work function adjustment layer 141 and a metal gate 140 capped with a cap insulating layer 142. The sidewall of the gate structure is covered by sidewall spacers 127 and an interlayer dielectric (ILD) layer 165 is further disposed over sidewall spacers 127.

The channel of the FinFET includes one or more first semiconductor layers 110 and one or more second semiconductor layers 112, alternately stacked over the base fin structure, thereby forming a channel fin structure. The first semiconductor layer 110 has a different lattice constant than the second semiconductor layer 112. The channel fin structure includes at least two pairs of the first semiconductor layer 110 and the second semiconductor layer 112 disposed on the first semiconductor layer 110. In FIGS. 1A and 1C, three pairs of the first semiconductor layer 110 and the second semiconductor layer 112 are disposed, while in FIGS. 31A-31C, two pairs of the first semiconductor layer 110 and the second semiconductor layer 112 are disposed. The number of the pairs can be four or more and up to, for example, ten (10).

The base fin 103 and the second semiconductor layer 112 are made of Si and the first semiconductor layer 110 is $Si_{1-x}Ge_x$ (hereinafter may be referred to as SiGe), where $0.05 \leq x \leq 0.95$ in some embodiments, and in certain embodiments, $0.15 \leq x \leq 0.55$. In this disclosure, when a semiconductor is referred to as Si or SiGe, they are crystalline unless otherwise defined. The composition (e.g., Ge content) of the first semiconductor layers 110 may vary within one layer and/or from one layer to another.

Figure 1E:
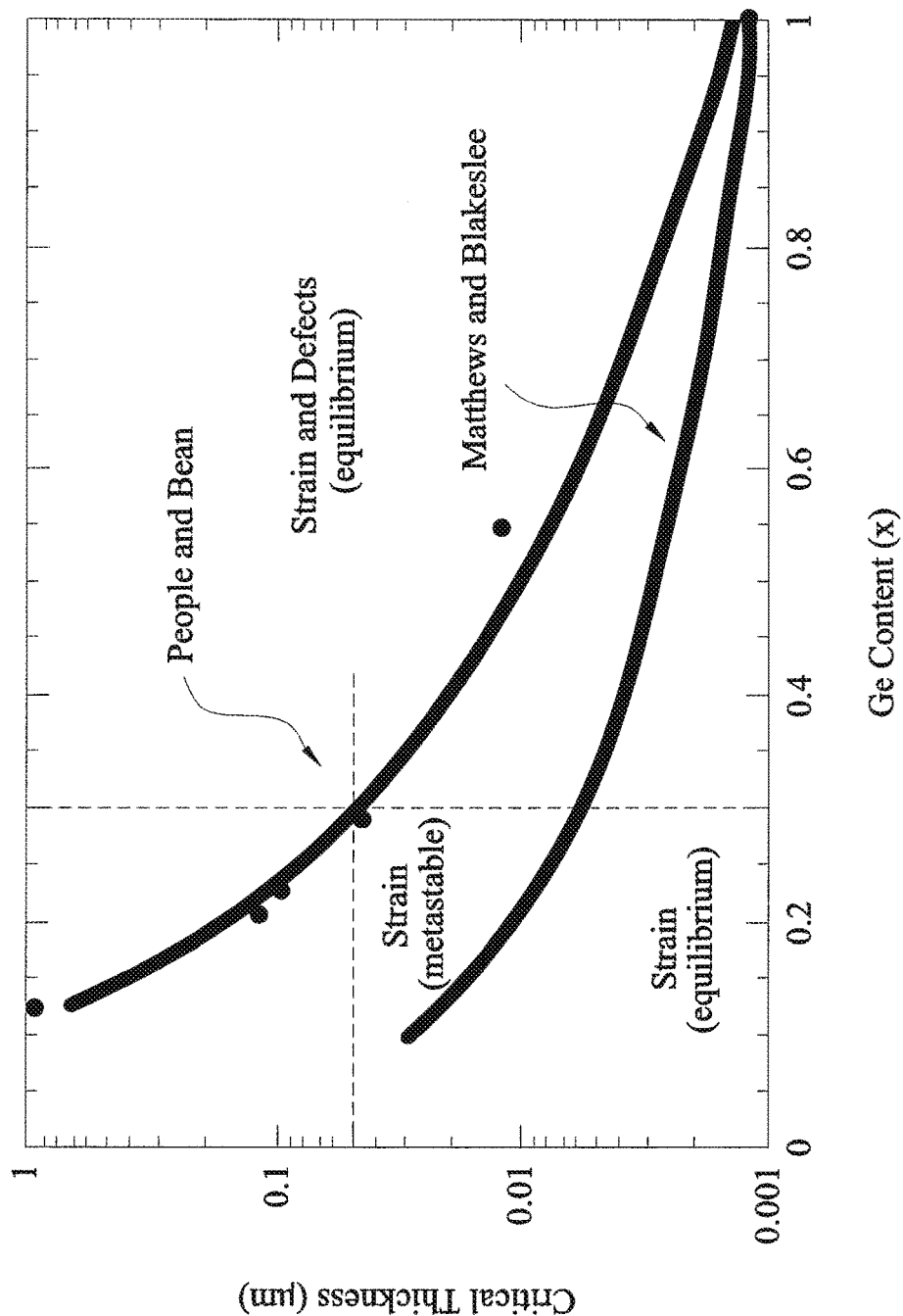
FIG. 1E shows a relationship between the critical thickness of SiGe formed on Si with respect to a Ge content.

A thickness of the first semiconductor layer 110 is greater than the thickness of the second semiconductor layer 112 in the pair in some embodiments. The thickness of the first semiconductor layer 110 is generally limited to such a thickness that no crystalline dislocation or defects are generated in the layer. Such a critical thickness (SiGe formed on Si) has been calculated by, for example, Matthews and Blakeslee (J. Cryst. Growth, 27, pp. 118-125 (1974)) and People and Bean (Appl. Phys. Lett., 47, pp. 322-324 (1985)), as shown in FIG. 1E. As the Ge content increases, the critical thickness decreases. For example, under the People and Bean model, when x=0.3, the critical thickness is about 52 nm. Generally, when the SiGe thickness is below the critical thickness, the SiGe layer does not include defects, and maintains strain caused by the lattice mismatch between Si and SiGe.

With respect to the strain, the strain may be lost or weakened by a thermal process performed subsequent to the epitaxial growth of the SiGe layer. Accordingly, to maintain the strain, a practical critical thickness becomes smaller than the critical thickness shown in FIG. 1E. For example, the practical critical thickness of SiGe formed on Si is equal to or less than 70% of the critical thickness provided by the People and Bean's model. The People and Bean's model can be approximated by the equation $Tc=1.23x^{-3.08}$. Thus, the thickness $T_{SiGe}$ of SiGe layer can be equal to or less than $0.861x^{-3.08}$, where x is the Ge content. In some embodiments, the thickness of SiGe layer satisfies $T_{Si} \leq 0.246x^{-3.08} \leq T_{SiGe} \leq 0.861x^{-3.08}$, where $T_{Si}$ is the thickness of the beam-like Si second semiconductor layer inserted between the first SiGe semiconductor layers. In other words, the thickness of the SiGe layer is about 20-70% of the critical thickness provided by the People and Bean's model. This model and the critical thickness ranges can be applied to other material combinations. Similarly, the Matthews and Blakeslee model can be approximated by the equation $Tc=0.97x^{-1.54}$. The practical critical thickness is located between the People and Bean's model and the Matthews and Blakeslee model.

In some embodiments, the thickness of the second semiconductor layers 112 is in a range from about 1 nm to about 10 nm. The thickness of the first semiconductor layers 110 is three to ten times the thickness of the second semiconductor layers 112 at least in one pair. The thickness of the first semiconductor layer 110 is in a range of about 10 nm to about 35 nm, where the Ge content is about $0.2 \leq x \leq 0.30$, in some embodiments. In other embodiments, the thickness of the first semiconductor layer 110 is in a range of about 10 nm to about 30 nm, where the Ge content is about $0.25 \leq x \leq 0.35$. Further, the thickness of the first semiconductor layer 110 is in a range of about 10 nm to about 40 nm, where the Ge content is about $0.15 \leq x \leq 0.25$, in certain embodiments.

In the present embodiments, after the first semiconductor layer 110 (SiGe) is formed on the base fin structure (Si) with a thickness of T11, the second semiconductor layer 112 with a smaller thickness T21 as a beam-like structure is formed, and then an additional first semiconductor layer 110 with a thickness T12, where T11 and T12 are greater than T21, is formed. By repeating this structure, it is possible to increase a channel height without causing crystalline defects and/or losing strain, thereby increasing a current density flowing through the channel of the FinFET.

In FIG. 1C, the thicknesses T11, T12 and T13 of the first semiconductor layers 110-1, 110-2 and 110-3 may be substantially the same or different. In some embodiments, T11>T12>T13. The thicknesses T21 and T22 of the second semiconductor layers 112-1 and 112-2 may be substantially the same or different. The thickness T23 of the uppermost second semiconductor layer 114 is equal to or greater than T21 and T22, and is in a range from about 5 nm to about 20 nm in some embodiments. In some embodiments, T21 and T22 are in a range from about 2 nm to about 6 nm.

The width of the first and second semiconductor layers along the X direction may be substantially equal to each other or different from each other. As shown in FIG. 1C, in some embodiments, the widths of the first and second semiconductor layers gradually decrease along the thickness direction (Z direction). In some embodiments, $W11x>W12x>W13x$.

The width of the first and second semiconductor layers along the Y direction may be substantially equal to each other or different from each other. As shown in FIG. 1D, in some embodiments, the widths of the first and second semiconductor layers gradually decrease along the thickness direction (Z direction). In some embodiments, $W11y>W21y>W12y>W22y>W13y>W23y$, and these widths are in a range from about 3 nm to about 20 nm in some embodiments. The widths are measured at the center of each layer.

As shown in FIGS. 1A and 1B, the second semiconductor layers 112 and 114 protrude from the first semiconductor layers 110 and extend into the source and the drain regions and the first semiconductor layers 110 do not substantially extend into the source and the drain region. In FIG. 1A, the source/drain regions refers to the region outside the region below the sidewall spacers.

The second semiconductor layers 112 and 114 in the source/drain regions are wrapped around one or more other semiconductor layers 130, which are epitaxially formed on the second semiconductor layers 112 and 114. In some embodiments, the semiconductor layers (epitaxial source/drain layers) 130 are made of different material than the second semiconductor layers. In other embodiments, the semiconductor layers 130 are made of the same material as the second semiconductor layers. In some embodiments, the epitaxial source/drain (S/D) layer 130 is made of $Si_{1-y}Ge_y$, where $0.1 \leq x \leq 0.9$. When the second semiconductor layers are made of SiGe, the Ge content of the epitaxial S/D layer 130 is greater than the Ge content of the second semiconductor layers. Each of the first semiconductor layers 110 is sandwiched by the S/D epitaxial layers 130 in the X (channel direction) direction, while each of the second semiconductor layers 112, 114 is sandwiched by the S/D epitaxial layers 130 in the Z (vertical) direction and Y direction (gate direction).

The epitaxial S/D layer 130 is further covered by a silicide or a metal-SiGe alloy layer 162 in some embodiments.

FIGS. 2A-24C illustrate various process stages in a semiconductor device fabrication process according to some embodiments of the present disclosure. Throughout the various views and illustrative embodiments, like reference numbers are used to designate like elements. In FIGS. 2A-24C, the "A" figures (e.g., FIGS. 1A, 2A, etc.) illustrate a perspective view, the "B" figures (e.g., FIGS. 1B, 2B, etc.) illustrate a cross-sectional view along the channel direction (the X direction), and the "C" figures (e.g., FIG. 1C, 2C, etc.) illustrate a cross-sectional view along the gate direction (Y direction) cutting the space between gates. It is understood that additional operations can be provided before, during, and after processes shown by FIGS. 2A-24C, and some of the operations described below can be replaced or eliminated, for additional embodiments of the method. The order of the operations/processes may be interchangeable.

Referring to FIGS. 2A-2C, FIGS. 2A-2C illustrate one of the various stages for a FinFET manufacturing process according to embodiments of the present disclosure.

As shown in FIGS. 2A-2C, stacked semiconductor layers are formed over a substrate 101. The stacked semiconductor layers include first semiconductor layers 10 and second semiconductor layers 12. The uppermost second semiconductor layer 14 has a thickness greater than the other second semiconductor layers 12 in some embodiments. In one embodiment, substrate 101 includes a single crystalline semiconductor layer on at least its surface portion. The substrate 101 may comprise a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 101 is made of Si. In other embodiments, at least the surface portion the substrate 101 includes Ge or SiGe.

The first semiconductor layers 10 and the second semiconductor layers 12 are made of materials having different lattice constants, and may include one or more layers of Si, Ge, SiGe, GaAs, InSb, GaP, GaSb, InAlAs, InGaAs, GaSbP, GaAsSb and InP. The first semiconductor layers 10 may have a smaller energy band gap than the second semiconductor layers 12.

In some embodiments, the first semiconductor layers 10 and the second semiconductor layers 12 are made of Si, a Si compound, SiGe, Ge or a Ge compound. In one embodiment, the first semiconductor layers 10 are $Si_{1-x}Ge_x$, where x is about $0.1 \leq x \leq 1.0$. In other embodiments, $0.2 \leq x \leq 0.4$. The second semiconductor layers 12 are Si or $Si_{1-y}Ge_y$, where x>y. In this disclosure, an "M" compound" or an "M based compound" means the majority of the compound is M.

In another embodiment, the second semiconductor layers 12 are $Si_{1-y}C_y$, where $0 \leq y \leq 0.1$, and the first semiconductor layers 10 are Si or $Si_{1-x}Ge_x$, where $0 \leq x \leq 1.0$, and the substrate 101 is $Si_{1-z}Ge_z$, where $x \leq z$.

In yet other embodiments, the first semiconductor layers 10 are made of $In_{1-x}Ga_xAs$, where x is in a range from about 0 to about 0.8, and the second semiconductor layer 12 is made of $In_{1-y}Ga_yAs$, where $x \leq y$ and y is in a range from about 0.5 to about 1.0.

In FIGS. 2A-2C, three pairs of the first semiconductor layer 10 and the semiconductor layer 12 are disposed on the substrate 101. However, the number of the pairs is not limited to three, and may be as small as 2 and up to 10. In some embodiments, 2-5 pairs of the first and second semiconductor layers are formed. By adjusting the numbers of the pairs, a driving current of the FinFET can be adjusted.

The first semiconductor layers 10 and the second semiconductor layers 12 are epitaxially formed over the substrate 10. As set forth above, the thickness of the first semiconductor layers 20 is greater than the thickness of the second semiconductor layers 12. The thickness of the uppermost second semiconductor layer 14 may be the same as, smaller than, or larger than the thickness of the first semiconductor layers 10.

In some embodiments, the thickness of the second semiconductor layers 12 is in a range from about 1 nm to about 5 nm. The thickness of the first semiconductor layers 10 is three to ten times the thickness of the second semiconductor layers 12 at least in one pair in some embodiments, and is four to eight times in other embodiments. When the first semiconductor is made of $Si_{1-x}Ge_x$ and the substrate and the second semiconductor layer are made of Si, the thickness of the first semiconductor layers 10 is in a range of about 10 nm to about 35 nm, where the Ge content is about $0.2 \leq x \leq 0.30$, in some embodiments. In other embodiments, the thickness of the first semiconductor layers 10 is in a range of about 10 nm to about 30 nm, where the Ge content is about $0.25 \leq x \leq 0.35$. Further, the thickness of the first semiconductor layers 10 is in a range of about 10 nm to about 40 nm, where the Ge content is about $0.15 \leq x \leq 0.25$, in certain embodiments. The thickness of each of the first semiconductor layers 10 and/or the thickness of each of the second semiconductor layers 12 may be the same, or may vary. The thickness of the uppermost second semiconductor layer 14 is in a range from about 5 nm to about 15 nm in some embodiments.

Figures 3A, 3B, 3C:
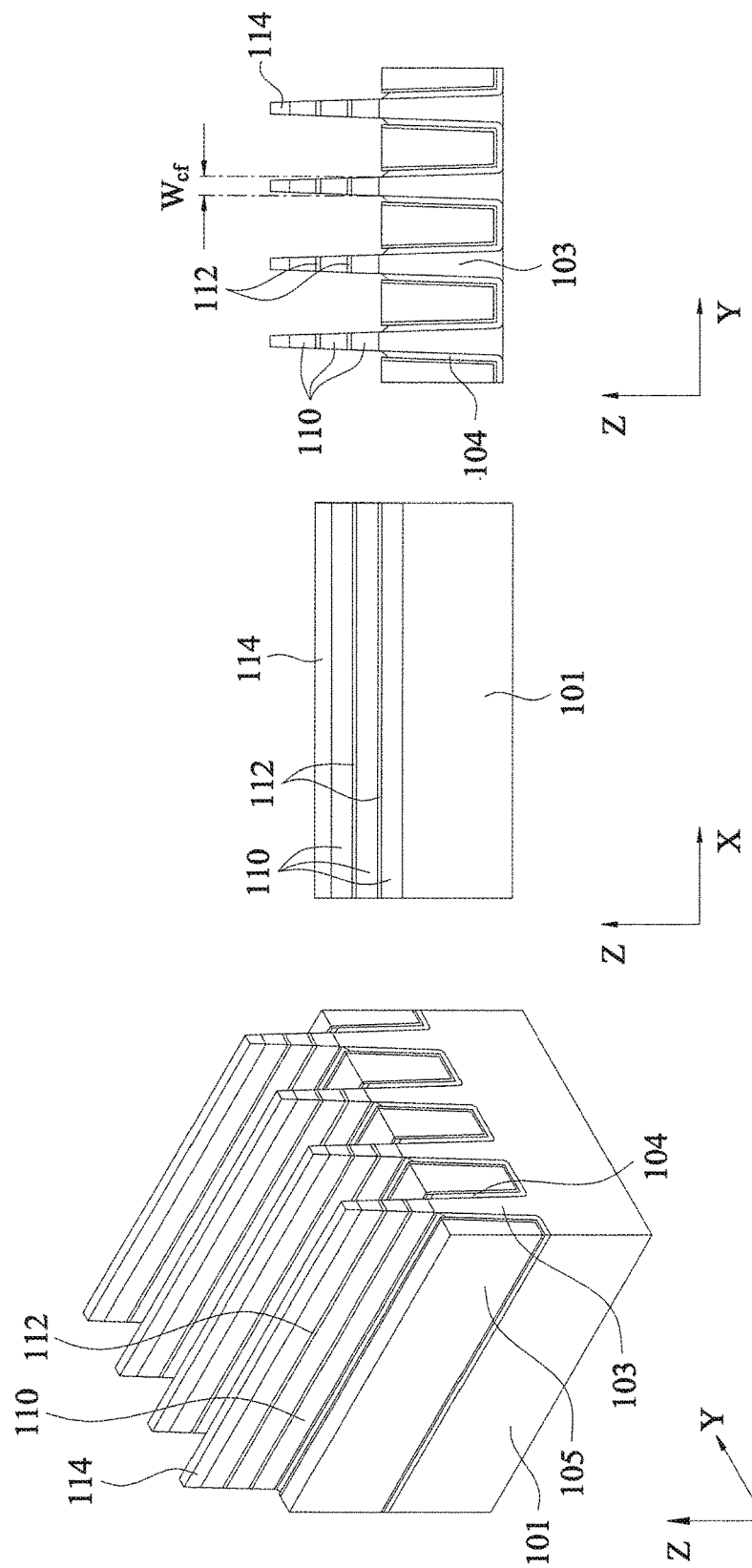
FIGS. 3A-3C illustrate one of the various process stages in a semiconductor device fabrication process according to some embodiments of the present disclosure.

Referring to FIGS. 3A-3C, FIGS. 3A-3C illustrate one of the various stages for a FinFET manufacturing process according to embodiments of the present disclosure.

The stacked structure shown in FIGS. 2A-2C is patterned by using photolithography and etching operations to form fin structures. To fabricate the fin structures, a mask layer is formed over the stacked layers. In some embodiments, the mask layer includes a first mask layer and a second mask layer. The first mask layer is a pad oxide layer made of a silicon oxide, which can be formed by a thermal oxidation, the second mask layer is made of a silicon nitride (SiN) formed by chemical vapor deposition (CVD), including low pressure CVD (LPCVD) and plasma enhanced CVD (PECVD); physical vapor deposition (PVD); atomic layer deposition (ALD); or other suitable process, in some embodiments. The mask layer is patterned into a mask pattern by using patterning operations including photolithography and etching.

Next, the stacked layers of the first and second semiconductor layers 10, 12 and the substrate 101 are patterned by using the patterned mask layer as an etching mask, thereby the stacked layers and the substrate are formed into fin structures extending in the Y direction. Each of the fin structures includes a base fin structure 103 corresponding to the substrate 101, and a channel fin structure including the first semiconductor layers 110 corresponding to the first semiconductor layers 10 and the second semiconductor layers 112 corresponding to the second semiconductor layer 12, as shown in FIGS. 3A-3C.

Some of the fin structures are for an n-type FET and some of the fin structures are for a p-type FET. In some embodiments, one or more dummy fin structures are formed adjacent to the fin structure(s) of an active FinFET. The fin structures extend in the X direction, are arranged in the Y direction and protrude in the Z direction.

The width $W_{cf}$ of the channel fin structure at the bottom most first semiconductor layer 110 along the Y direction is in a range from about 5 nm to about 20 nm in some embodiments, and is in a range from about 6 nm to about 10 nm in other embodiments.

After the fin structures are formed, a liner layer 104 and an isolation insulating layer 105, both including one or more layers of insulating material is formed over the substrate and the fin structures. The insulating material for the liner layer 104 includes one or more of silicon oxide, silicon nitride and silicon oxynitride (SiON). The insulating material for the isolation insulating layer 105 includes one or more of silicon oxide, silicon nitride, silicon oxynitride (SiON), SiOCN, fluorine-doped silicate glass (FSG), or a low-K dielectric material, formed by LPCVD (low pressure chemical vapor deposition), plasma-CVD or flowable CVD. An anneal operation may be performed after the formation of the isolation insulating layer 105. Then, a planarization operation, such as a chemical mechanical polishing (CMP) method and/or an etch-back method, is performed. Then, the isolation insulating layer 105 is recessed to expose the channel fin structures, as shown in FIGS. 3A-3C. As shown in FIGS. 3A-3C, the upper portion of the base fin structures is slightly exposed ($\approx$1-5 nm) from the isolation insulating layer 105 in some embodiments.

Referring to FIGS. 4A-4C, FIGS. 4A-4C illustrate one of the various stages for a FinFET manufacturing process according to embodiments of the present disclosure.

In some embodiments, an optional cap semiconductor layer 118 is formed over the channel fin structures. In some embodiments, the cap semiconductor layer 118 is made of the same material as the second semiconductor layers 112. The thickness of the cap semiconductor layer 118 is in a range from about 0.5 nm to about 3 nm in some embodiments.

Figures 5A, 5B, 5C:
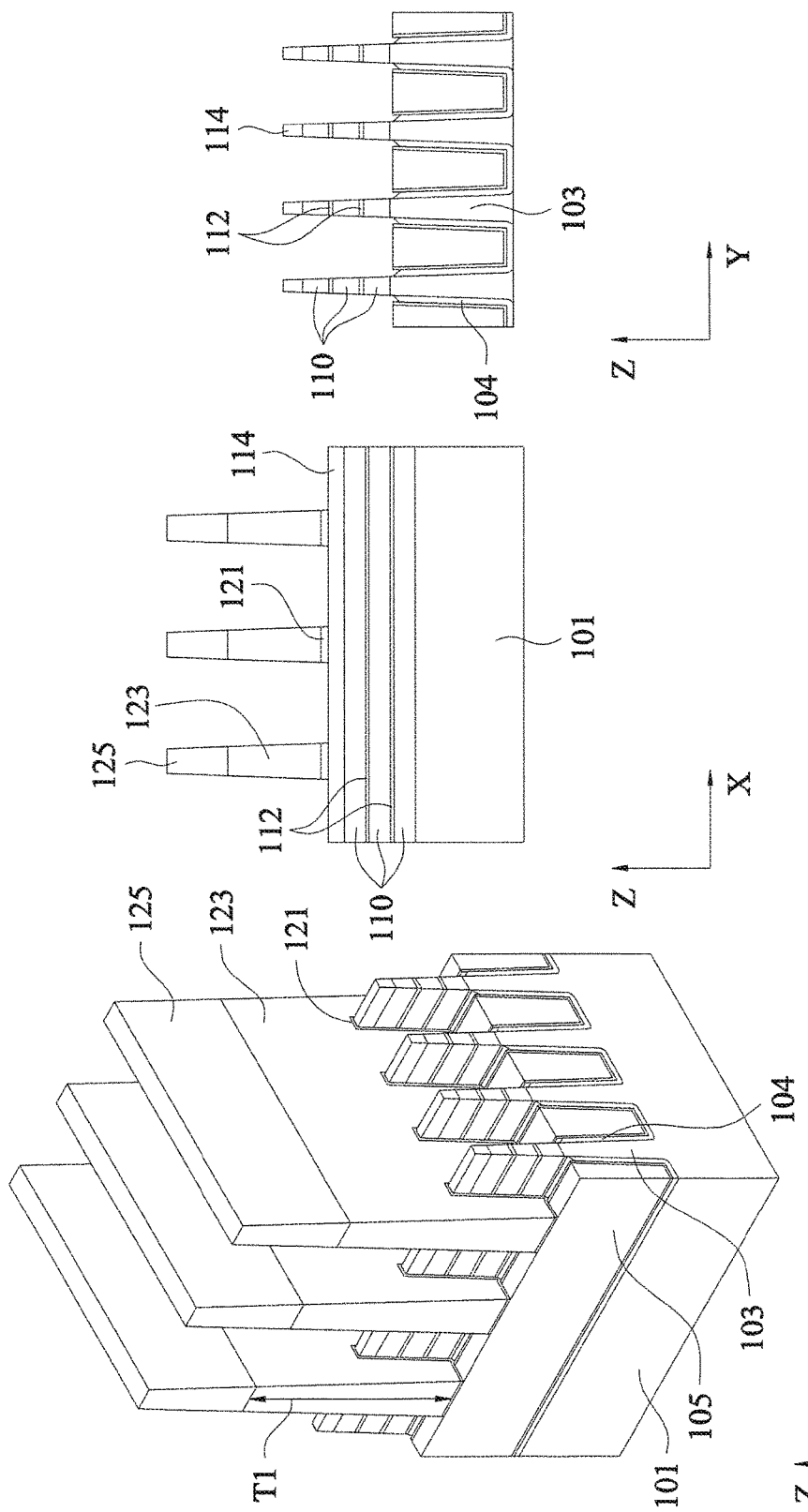
FIGS. 5A-5C illustrate one of the various process stages in a semiconductor device fabrication process according to some embodiments of the present disclosure.

After the fin structures are formed in FIGS. 3A-3C, a dummy gate structure including a dummy gate dielectric layer 121 and a dummy gate electrode 123 are formed over the channel fin structure as shown in FIGS. 5A-5C. The dummy gate dielectric layer and the dummy gate electrode will be subsequently used to define and form the source/drain regions.

The dummy gate structures are formed by first blanket depositing a dummy gate dielectric layer over the fin structures. The dummy gate dielectric layer includes one or more layers of silicon oxide, silicon nitride or silicon oxynitride. The thickness of the dummy gate dielectric layer is in a range from about 1 nm to about 5 nm in some embodiments. A dummy gate electrode layer is then blanket deposited on the dummy gate dielectric layer and over the channel fin structures, such that the channel fin structures are fully embedded in the dummy gate electrode layer. In some embodiments, the dummy electrode layer is a conductive material and may be selected from a group comprising amorphous silicon, poly silicon, amorphous germanium, poly germanium, amorphous silicon-germanium, poly silicon-germanium, metallic nitrides, metallic silicides, metallic oxides, and metals. The dummy electrode layer may be deposited by PVD, CVD, sputter deposition, or other techniques known and used in the art for depositing conductive materials. Other materials, conductive and non-conductive, may be used. In one embodiment, poly-Si is used. The thickness T1 of the dummy gate electrode layer is in a range from about 100 nm to about 200 nm in some embodiments. In some embodiments, the dummy gate electrode layer is subjected to a planarization operation.

Subsequently, a mask pattern 125 is formed over the dummy gate electrode layer 123. The mask pattern 125 includes one or more layers of SiN and silicon oxide in some embodiments. The mask pattern 125 may be formed by a patterning operation on one or more layers of SiN and silicon oxide. The dummy gate electrode layer is patterned into the dummy gate structures including the dummy gate electrode 123 and the dummy gate dielectric layer 121, as shown in FIGS. 5A and 5B. The dummy gate structures are formed over portions of the channel fin structure which are to be channels of FinFETs. Further, by patterning the dummy gate structure, the stacked layers of the first and second semiconductor layers are partially exposed on opposite sides of the dummy gate structure, as source/drain (S/D) regions. In this disclosure, a source and a drain are interchangeably used and the structures thereof are substantially the same. In FIGS. 5A-5C, three dummy gate structures are formed, but the number of the dummy gate structures is not limited.

Referring to FIGS. 6A-6C, FIGS. 6A-6C illustrate one of the various stages for a FinFET manufacturing process according to embodiments of the present disclosure.

Subsequently, sidewall spacers 127 are formed along sidewalls of the dummy gate structures. The sidewall spacers 127 may be formed by depositing and anisotropic etching an insulating layer deposited over the dummy gate structures, the fin structures, and the isolation insulating layer 105. In some embodiments, the sidewall spacers 127 are formed of silicon nitride, and may have a single-layer structure. In alternative embodiments, the sidewall spacers 127 may have a composite structure including a plurality of layers. For example, the sidewall spacers 127 may include a silicon oxide layer and a silicon nitride layer over the silicon oxide layer. Other materials, such as $SiO_2$, SiCN, SiON, SiN, SiOCN, other low k material, or combinations thereof, may also be used. The thickness of the sidewall spacer 127 is in a range from about 5 nm to about 40 nm in some embodiments.

After the sidewall spacers 127 are formed, the uppermost second semiconductor layer 114 is also etched by an amount D1 in a range from about 1 nm to about 5 nm, in some embodiments. If a cap semiconductor layer 118 is used, the cap semiconductor layer 118 is also etched during the etching operation of the sidewall spacer etching operation.

Referring to FIGS. 7A-7C, FIGS. 7A-7C illustrate one of the various stages for a FinFET manufacturing process according to embodiments of the present disclosure.

After the dummy gate structure and the sidewall spaces are formed, the first semiconductor layers 110 exposed at the S/D region are removed. When the first semiconductor layers 110 are Ge or SiGe and the second semiconductor layers 112 are Si, the first semiconductor layers 110 can be selectively removed using a wet etchant such as, but not limited to ammonium hydroxide ($NH_4OH$), tetramethylammonium hydroxide (TMAH), ethylenediamine pyrocatechol (EDP), a potassium hydroxide (KOH) solution, a hydrochloric acid (HCl) solution, or a hot ammonia solution. A plasma dry etching or a chemical vapor etching may also be used.

In some embodiments, the first semiconductor layers 110 are pushed toward the inside of the channel (proximity push etching) such that the ends of the first semiconductor layers 110 are located under the sidewall spacers 127 or the dummy gate electrode layer 123. The amount $D_{px}$ of the proximity push etching is in a range from about 1 nm to about 10 nm from the plane extending from the bottom portion of the sidewall spacer 127, in some embodiments. With this proximity push etching, it is possible to maintain channel strain. Further, because of the beam-like second semiconductor layers 112 in the S/D region, it is also possible to maintain the channel strain.

Referring to FIGS. 8A-8C, FIGS. 8A-8C illustrate one of the various stages for a FinFET manufacturing process according to embodiments of the present disclosure.

After the first semiconductor layers 110 are removed, the second semiconductor layers 112 are exposed in the S/D regions. Then, an S/D epitaxial layer 130 is epitaxially formed on the exposed second semiconductor layers 112. As shown ins FIGS. 8A-8C, the S/D epitaxial layer 130 wraps around the each of the second semiconductor layers 112.

When the second semiconductor layers 112 are made of Si, the S/D epitaxial layer 130 is made of $Si_{1-x}Ge_x$, where the Ge content x is greater than the Ge content of the first semiconductor layers 110. In some embodiments, Ge content x of the S/D epitaxial layer 130 is in a range from about 0.4 to about 1.0.

Figure 8E:
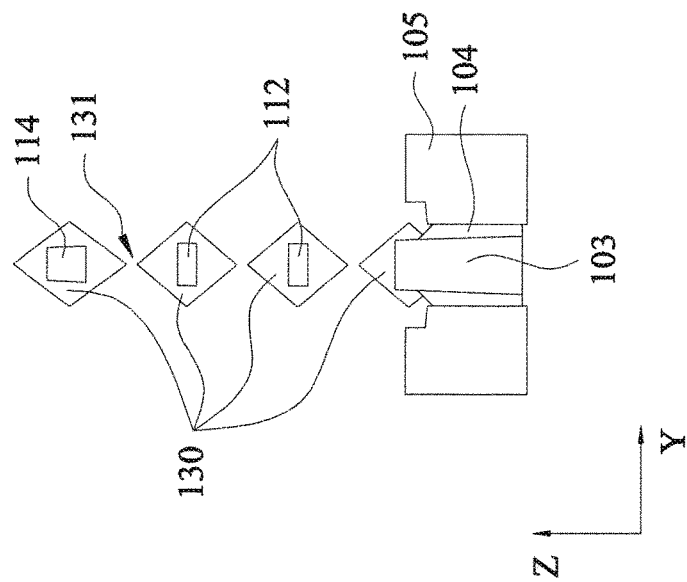
Figure 8D:
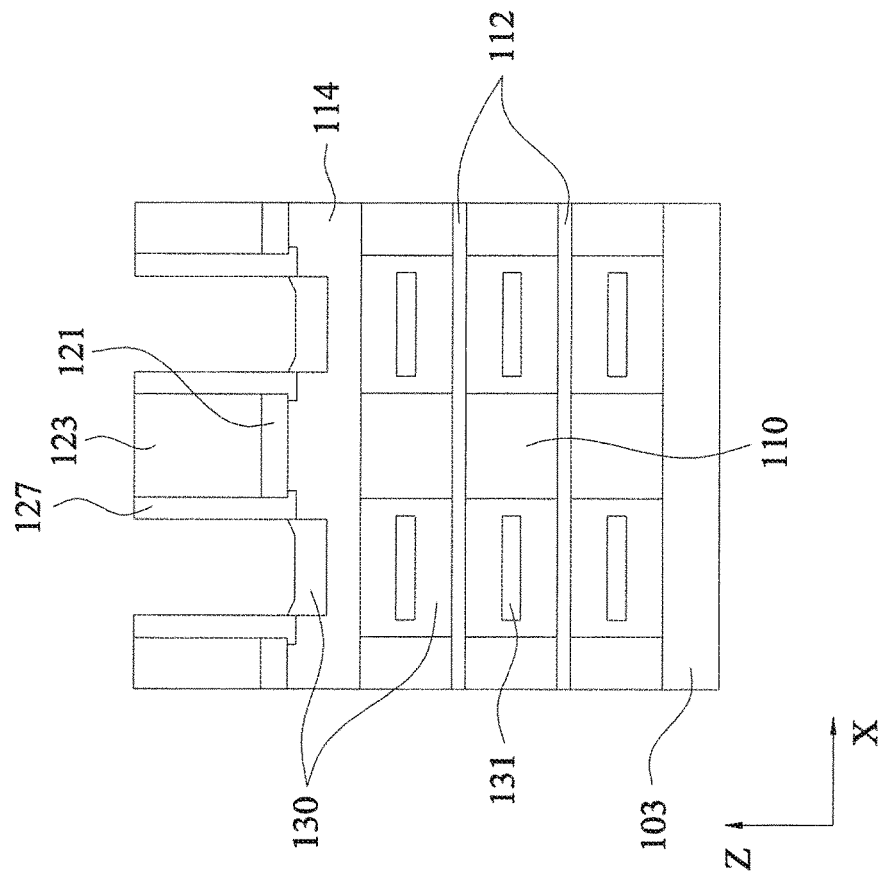

In some embodiments, there is a gap or a space 131 between the S/D epitaxial layers 130 formed on adjacent second semiconductor layers 112, as shown in FIGS. 8D and 8E. In other embodiments, the S/D epitaxial layers 130 merge with each other and there is no gap or space between the S/D epitaxial layers 130 formed on adjacent second semiconductor layers 112.

In other embodiments, SiC, SiCP and/or SiP are utilized as the S/D epitaxial layers 130. In the case where the channel is a compound semiconductor such as $In_mGa_{1-m}As$, the doped epitaxial film may be, for example, $In_nGa_{1-n}As$, where n is smaller than or equal to m.

Figures 9A, 9B, 9C:
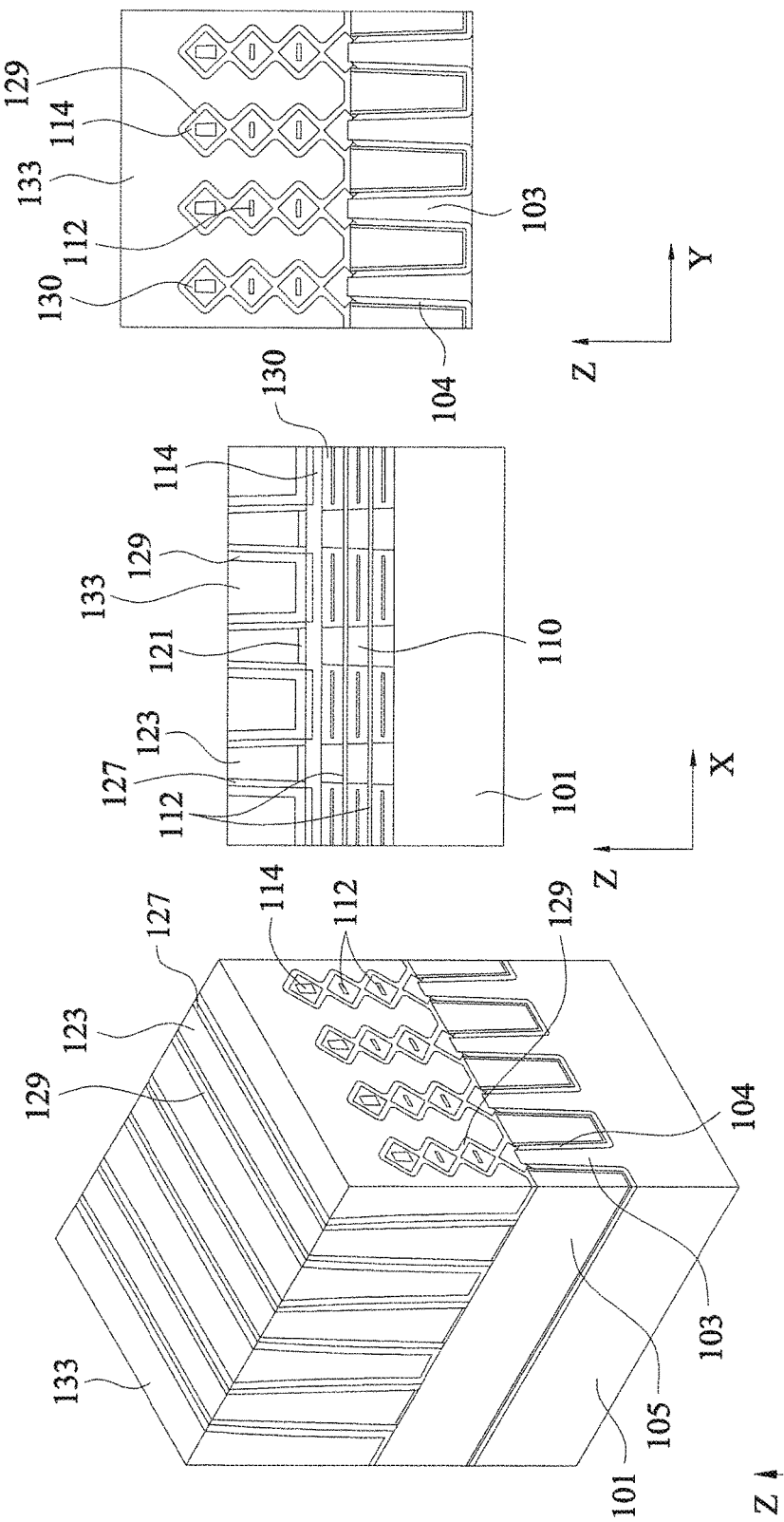
FIGS. 9A-9C illustrate one of the various process stages in a semiconductor device fabrication process according to some embodiments of the present disclosure.

Referring to FIGS. 9A-9C, FIGS. 9A-9C illustrate one of the various stages for a FinFET manufacturing process according to embodiments of the present disclosure.

After the S/D epitaxial layer 130 is formed, a contact etch-stop layer (CESL) 129 is formed and then a first ILD layer 133 is formed over the S/D regions, the isolation insulating layer and between the dummy gate structures.

The CESL 129 includes one or more layers of silicon oxide, silicon nitride and silicon oxynitride (SiON). The thickness of the CSEL 129 is in a range from about 1 nm to about 20 nm in some embodiments.

The first ILD layer 133 may include a single layer or multiple layers. In some embodiments, the first ILD layer 133 includes $SiO_2$, SiCN, SiOC, SiON, SiOCN, SiN or a low-k material, but other suitable dielectric film may be used. The first ILD layer 133 maybe formed by CVD, PECVD or ALD, FCVD, or a spin-on-glass process. A planarization process, such as a CMP process, may be performed to remove excess materials. By the planarization process, the upper surface of the dummy gate electrode layer 123 is exposed in some embodiments.

Referring to FIGS. 10A-10C, FIGS. 10A-10C illustrate one of the various stages for a FinFET manufacturing process according to embodiments of the present disclosure.

Subsequently, the dummy gate electrode 123 and the dummy gate dielectric layer 121 are removed, thereby forming gate spaces 135. The removal process may include one or more etch processes. For example in some embodiments, the removal process includes selectively etching using either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like. The dummy gate dielectric layer may be removed using a wet etch process, such as a diluted HF acid, may be used. Other processes and materials may be used.

Figures 11A, 11B, 11C:
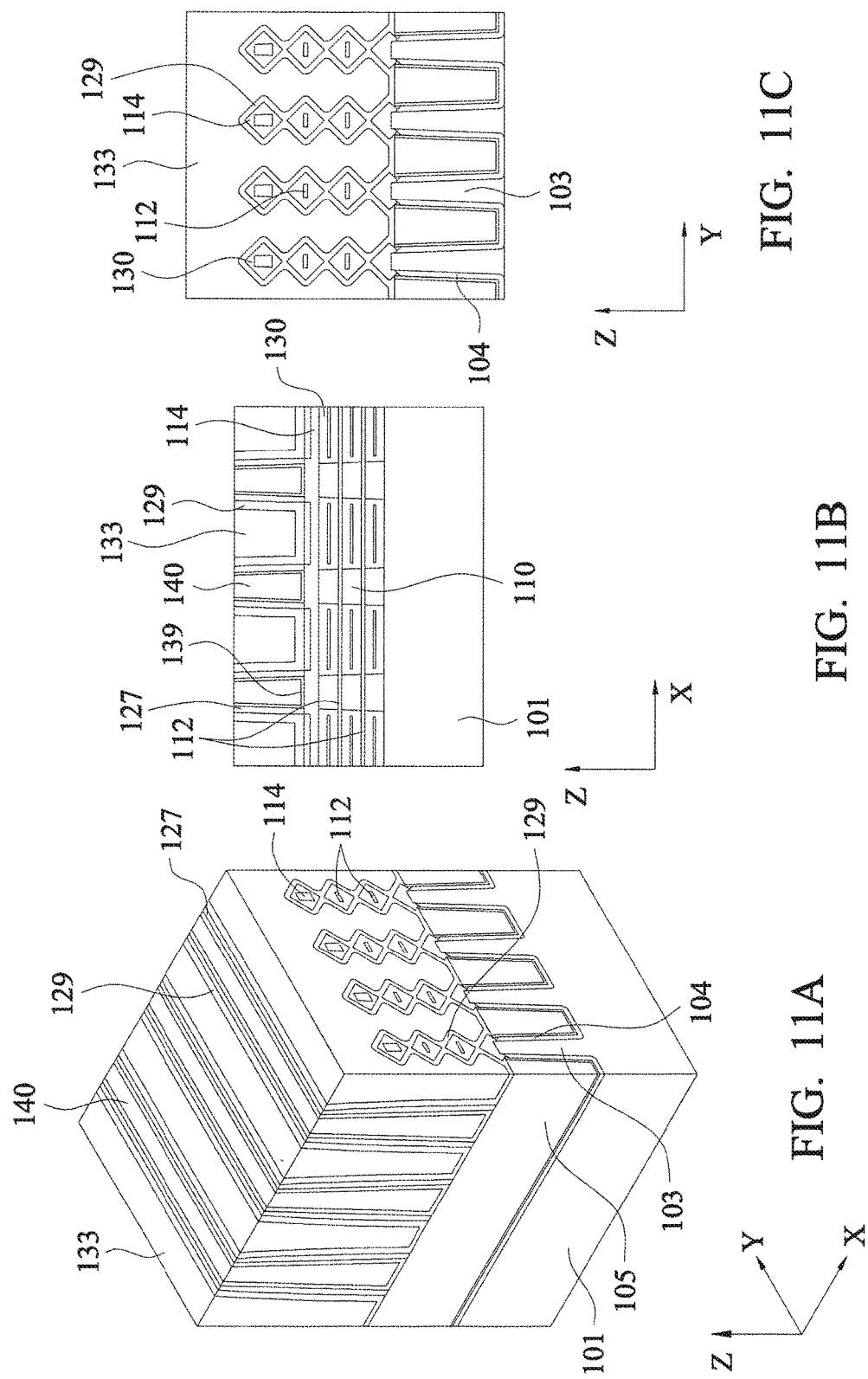
FIGS. 11A-11C illustrate one of the various process stages in a semiconductor device fabrication process according to some embodiments of the present disclosure.

Referring to FIGS. 11A-11C, FIGS. 11A-11C illustrate one of the various stages for a FinFET manufacturing process according to embodiments of the present disclosure.

After the dummy gate structure is removed, a gate dielectric layer 139 is formed over the channel fin structure. In some embodiments, the gate dielectric layer 139 includes one or more high-k dielectric layers (e.g., having a dielectric constant greater than 3.9). For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $PbTi_xO_y$, $PbZr_xTi_yO_z$, SiCN, SiON, SiN, $Al_2O_3$, $La_2O_3$, $Ta_2O_3$, $Y_2O_3$, $HfO_2$, $ZrO_2$, HfSiON, $YGe_xO_y$, $YSi_xO_y$ and $LaAlO_3$, and the like. The formation methods of gate dielectric layer 139 include molecular-beam deposition (MBD), ALD, PVD, and the like. In some embodiments, the gate dielectric layer 139 has a thickness of about 0.5 nm to about 5 nm. In some embodiments, the gate dielectric layer 139 is formed also on sides of the sidewall spacers 127.

In some embodiments, an interfacial layer (not shown) may be formed over the channel fin structure prior to forming the gate dielectric layer 139, and the gate dielectric layer 139 is formed over the interfacial layer. The interfacial layer helps buffer the subsequently formed high-k dielectric layer from the underlying semiconductor material. In some embodiments, the interfacial layer is a chemical silicon oxide, which may be formed by chemical reactions. For example, a chemical silicon oxide may be formed using deionized water+ozone ($DIO_3$), $NH_4OH+H_2O_2+H_2O$ (APM), or other methods. Other embodiments may utilize a different material or processes for the interfacial layer. In an embodiment, the interfacial layer has a thickness of about 0.2 nm to about 1 nm.

After the gate dielectric layer 139 is formed, a gate electrode 140 is formed over the gate dielectric layer 139. The gate electrode 140 may be a metal selected from a group of W, Cu, Ti, Ag, Al, TiAl, TiAlN, TaC, TaCN, TaSiN, Mn, Co, Pd, Ni, Re, Jr, Ru, Pt, and Zr. In some embodiments, the gate electrode 140 includes a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, the gate electrode 140 has a thickness in the range of about 5 nm to about 100 nm. The gate electrode 140 may be formed using a suitable process such as ALD, CVD, PVD, plating, or combinations thereof. A planarization process, such as a CMP, may be performed to remove excess materials.

In certain embodiments of the present disclosure, one or more work function adjustment layers 141 (see, FIG. 1A) are disposed on the gate dielectric layer 139 before forming the gate electrode 140. The work function adjustment layer 141 is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer.

Figures 12A, 12B, 12C:
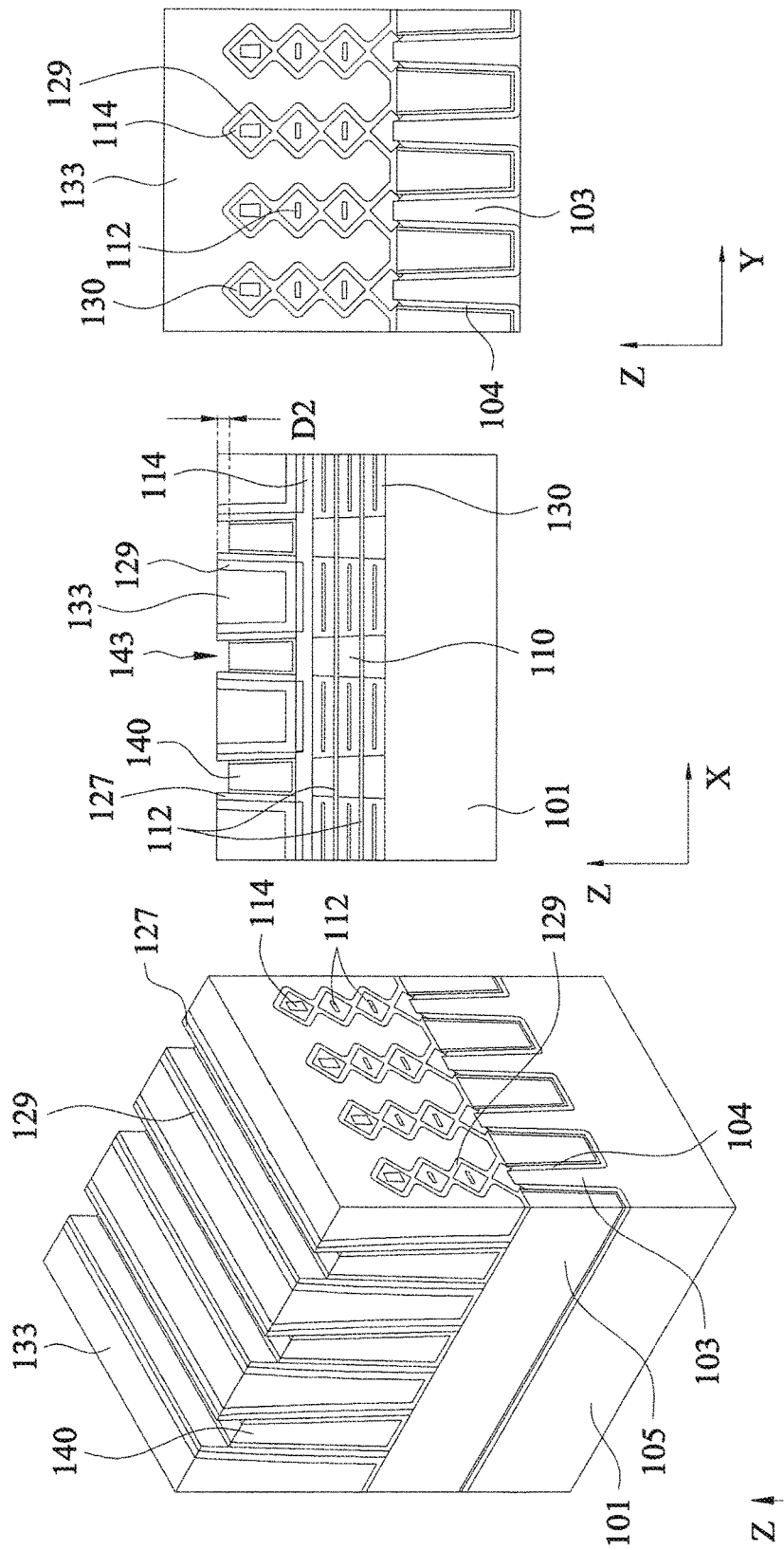
FIGS. 12A-12C illustrate one of the various process stages in a semiconductor device fabrication process according to some embodiments of the present disclosure.

Referring to FIGS. 12A-12C, FIGS. 12A-12C illustrate one of the various stages for a FinFET manufacturing process according to embodiments of the present disclosure.

Then, the gate electrode 140 and the work function adjustment layer are recessed, thereby forming gate recesses 143. The depth D2 of the gate recesses 143 is in a range from about 10 nm to about 100 nm in some embodiments. In some embodiments, when the gate electrode 140 is mainly made of W, the gate electrode may be recessed using, for example, a dry etch process using $Cl_2/O_2/BCl_3$, at a temperature range of 24° C. to 150° C., and at a pressure of below 1 Torr.

Referring to FIGS. 13A-13C, FIGS. 13A-13C illustrate one of the various stages for a FinFET manufacturing process according to embodiments of the present disclosure.

The gate recesses 143 are filled with an insulating material, thereby forming gate cap layers 142 on the recessed gate electrodes 140. The gate cap layers 142 protect the gate electrodes 140 during subsequent processes. In some embodiments, the gate cap layer 142 includes $SiO_2$, SiCN, SiON, SiN, $Al_2O_3$, $La_2O_3$, a combination thereof, or the like, but other suitable dielectric films may be used. The gate cap layer 142 may be formed using, for example, CVD, PVD, spin-on, or the like. Other suitable process steps may be used. A planarization process, such as a CMP, may be performed to remove excess materials.

Figures 14A, 14B, 14C:
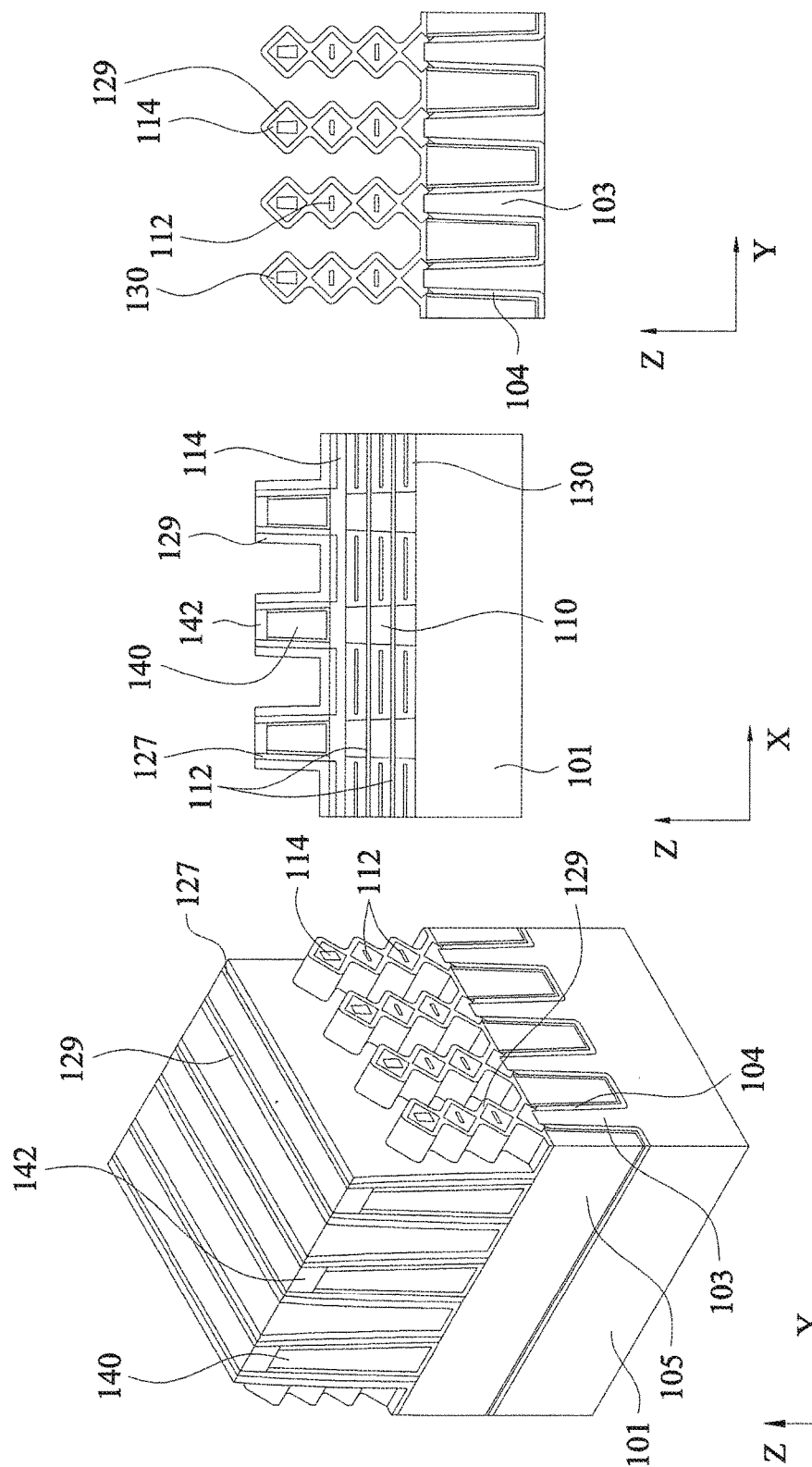
FIGS. 14A-14C illustrate one of the various process stages in a semiconductor device fabrication process according to some embodiments of the present disclosure.

Referring to FIGS. 14A-14C, FIGS. 14A-14C illustrate one of the various stages for a FinFET manufacturing process according to embodiments of the present disclosure.

After the gate cap layers 142 are formed, the first ILD layer 133 is removed by using a suitable etching operation.

Referring to FIGS. 15A-15C, FIGS. 15A-15C illustrate one of the various stages for a FinFET manufacturing process according to embodiments of the present disclosure.

After the first ILD layer 133 is removed, a sacrificial layer 150 is formed to fully cover the gate electrodes. The sacrificial layer 150 is made of one or more layers of amorphous silicon, poly silicon, amorphous germanium, poly germanium, amorphous silicon-germanium, poly silicon-germanium, metallic nitrides, metallic silicides, metallic oxides, and metals, which has a high etching selectivity (e.g., 5 or more) with respect to silicon oxide based material and silicon nitride based material. The sacrificial layer 150 may be deposited by PVD, CVD, sputter deposition, or other techniques known and used in the art for depositing conductive materials.

Figures 16A, 16B, 16C:
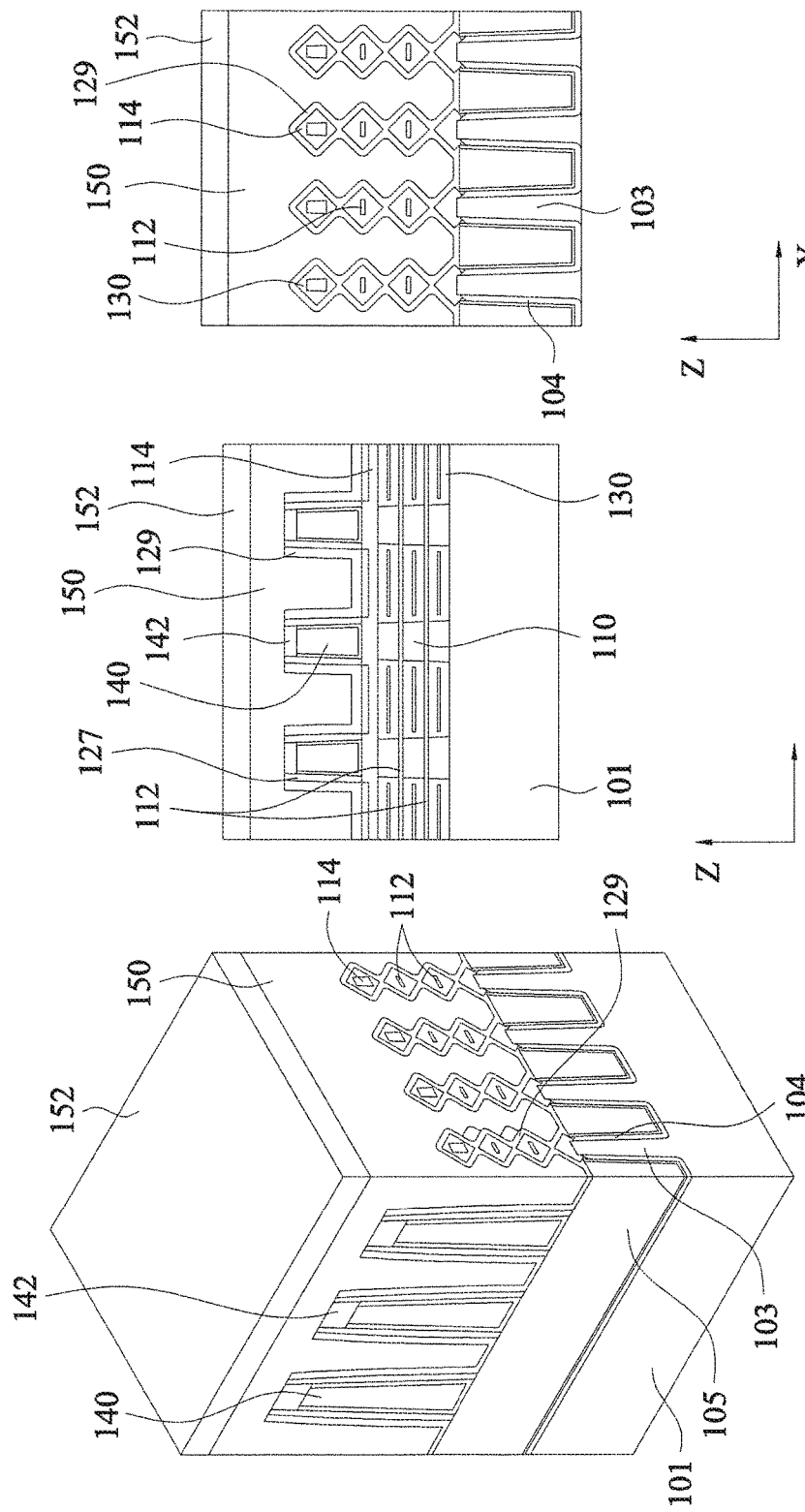
FIGS. 16A-16C illustrate one of the various process stages in a semiconductor device fabrication process according to some embodiments of the present disclosure.

Referring to FIGS. 16A-16C, FIGS. 16A-16C illustrate one of the various stages for a FinFET manufacturing process according to embodiments of the present disclosure.

A hard mask layer 152 is formed on the sacrificial layer 150. The hard mask layer 152 includes one or more layers of $SiO_2$, SiCN, SiON, SiN, $Al_2O_3$, $La_2O_3$, or the like, but other suitable dielectric films may be used. The hard mask layer 152 may be deposited by PVD, CVD, sputter deposition, or other techniques known and used in the art for depositing conductive materials.

Figures 17A, 17B, 17C:
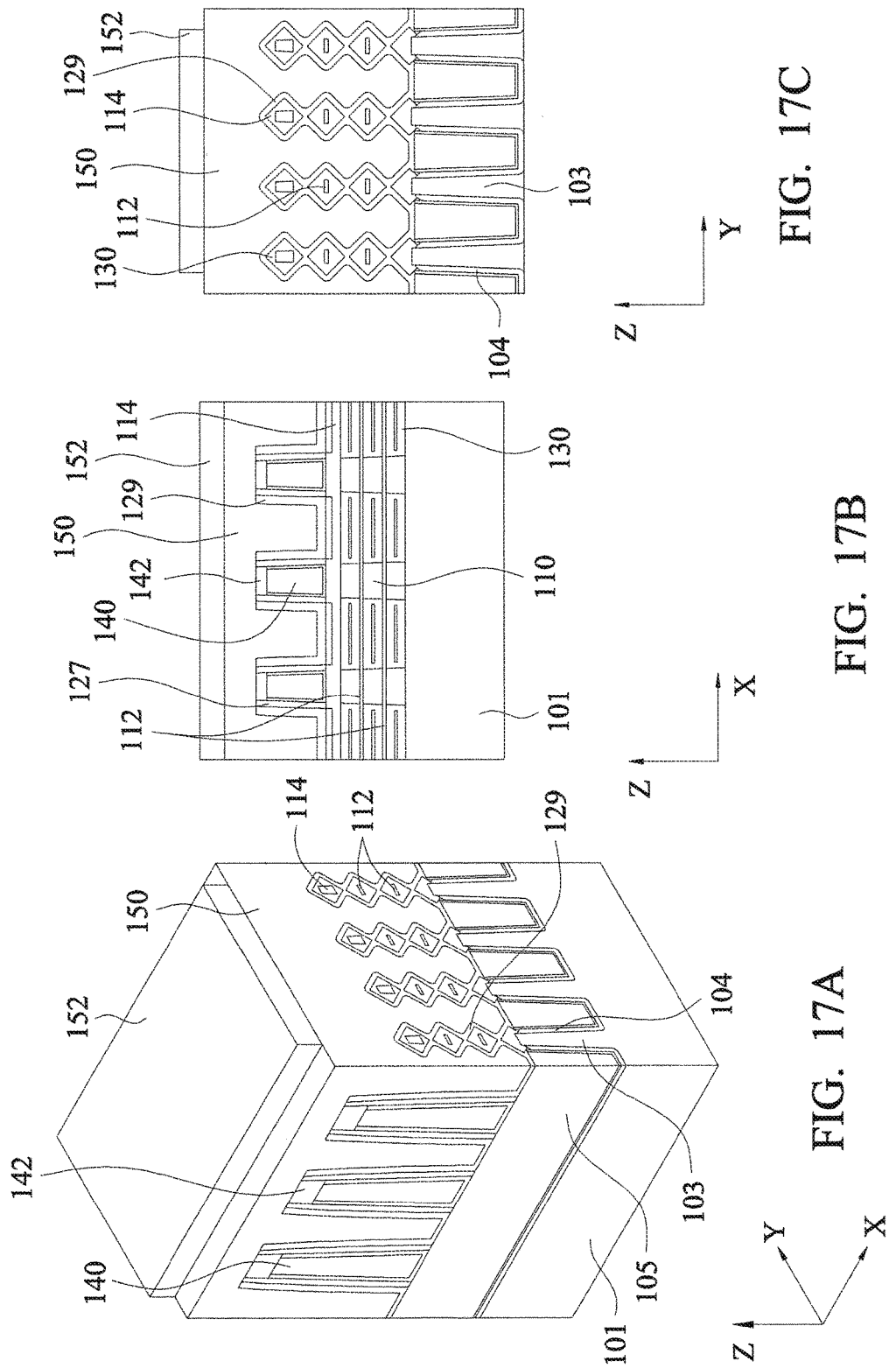
FIGS. 17A-17C illustrate one of the various process stages in a semiconductor device fabrication process according to some embodiments of the present disclosure.

Referring to FIGS. 17A-17C, FIGS. 17A-17C illustrate one of the various stages for a FinFET manufacturing process according to embodiments of the present disclosure.

Then, the hard mask layer 152 is patterned by using photolithography and etching operations. The patterned hard mask layer 152 covers a region in which a S/D contact is subsequently formed.

Referring to FIGS. 18A-18C, FIGS. 18A-18C illustrate one of the various stages for a FinFET manufacturing process according to embodiments of the present disclosure.

By using the patterned hard mask layer 152 as an etching mask, the sacrificial layer 150 is etched, thereby forming openings 153. The sacrificial layer 150 can be etched either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3:NH_4F:H_2O$, and/or the like.

Figures 19A, 19B, 19C:
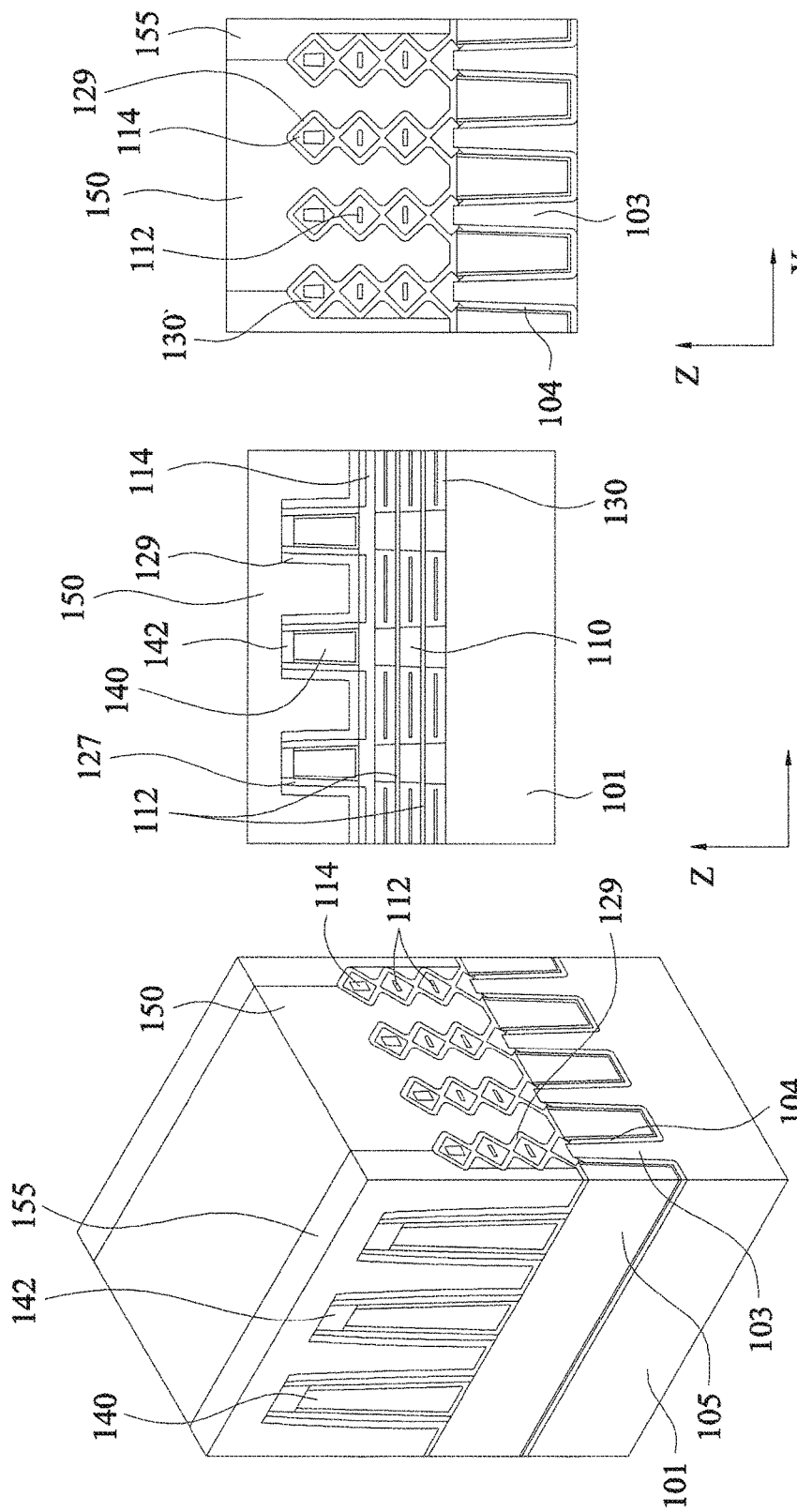
FIGS. 19A-19C illustrate one of the various process stages in a semiconductor device fabrication process according to some embodiments of the present disclosure.

Referring to FIGS. 19A-19C, FIGS. 19A-19C illustrate one of the various stages for a FinFET manufacturing process according to embodiments of the present disclosure.

After the openings 153 are formed, the openings are filled with a second ILD layer 155. The second ILD layer 155 may include a single layer or multiple layers. In some embodiments, the second ILD layer 155 includes $SiO_2$, SiCN, SiOC, SiON, SiOCN, SiN or a low-k material, but other suitable dielectric film may be used. The second ILD layer 155 maybe formed by CVD, PECVD or ALD, FCVD, or a spin-on-glass process. A planarization process, such as a CMP process, may be performed to remove excess materials.

Referring to FIGS. 20A-20C, FIGS. 20A-20C illustrate one of the various stages for a FinFET manufacturing process according to embodiments of the present disclosure.

After the second ILD layer 155 is formed, the sacrificial layer 150 is removed, thereby forming S/D contact openings 158. The etching operation to remove the sacrificial layer 150 substantially stops on the CESL 129.

Referring to FIGS. 21A-21C, FIGS. 21A-21C illustrate one of the various stages for a FinFET manufacturing process according to embodiments of the present disclosure.

After the S/D contact openings 158 are formed, the CESL 129 is removed from the S/D epitaxial layers 130 by using a suitable etching operation. In some embodiments, the CESL 129 is not fully removed from the S/D epitaxial layers 130 when the S/D epitaxial layer (fin channel) is located closed or on the edge of the S/D contact opening 158.

Figure 22D:
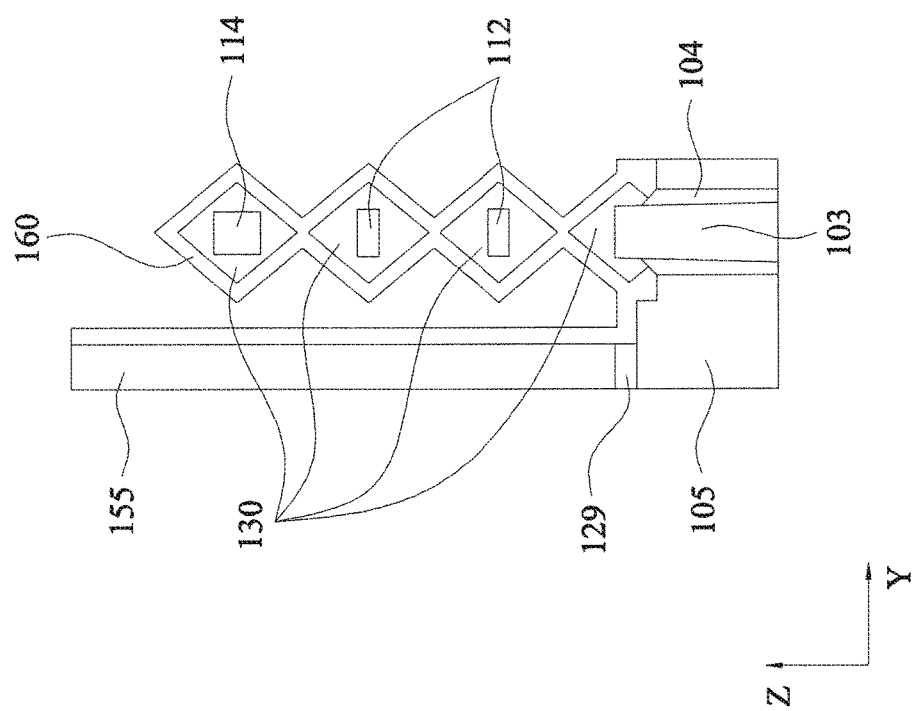

Referring to FIGS. 22A-22D, FIGS. 22A-22D illustrate one of the various stages for a FinFET manufacturing process according to embodiments of the present disclosure. FIG. 22D is an enlarged view of one fin structure of FIG. 22C.

After the S/D epitaxial layers 130 are exposed by removing the CESL 129, a metal layer 160 for silicide formation is formed on the exposed S/D epitaxial layers 130. The metal layer 160 includes one or more of Ti, Ta, Ni Co and W. The thickness of the metal layer 160 is in a range from about 1 nm to about 10 nm in some embodiments. In certain embodiments, a cover layer made of TiN is further formed on the metal layer 160.

In certain embodiments, as shown in FIG. 22D, the metal layer 160 fully fills the gap/space between the adjacent S/D epitaxial layers 130. Further, the metal layer 160 is also formed on the sidewall of the second ILD 155 and the upper surface of the isolation insulating layer 105.

The metal layer 160 and the cover layer may be formed using a suitable process such as ALD, CVD, PVD, plating, or combinations thereof.

Figures 23A, 23B, 23C:
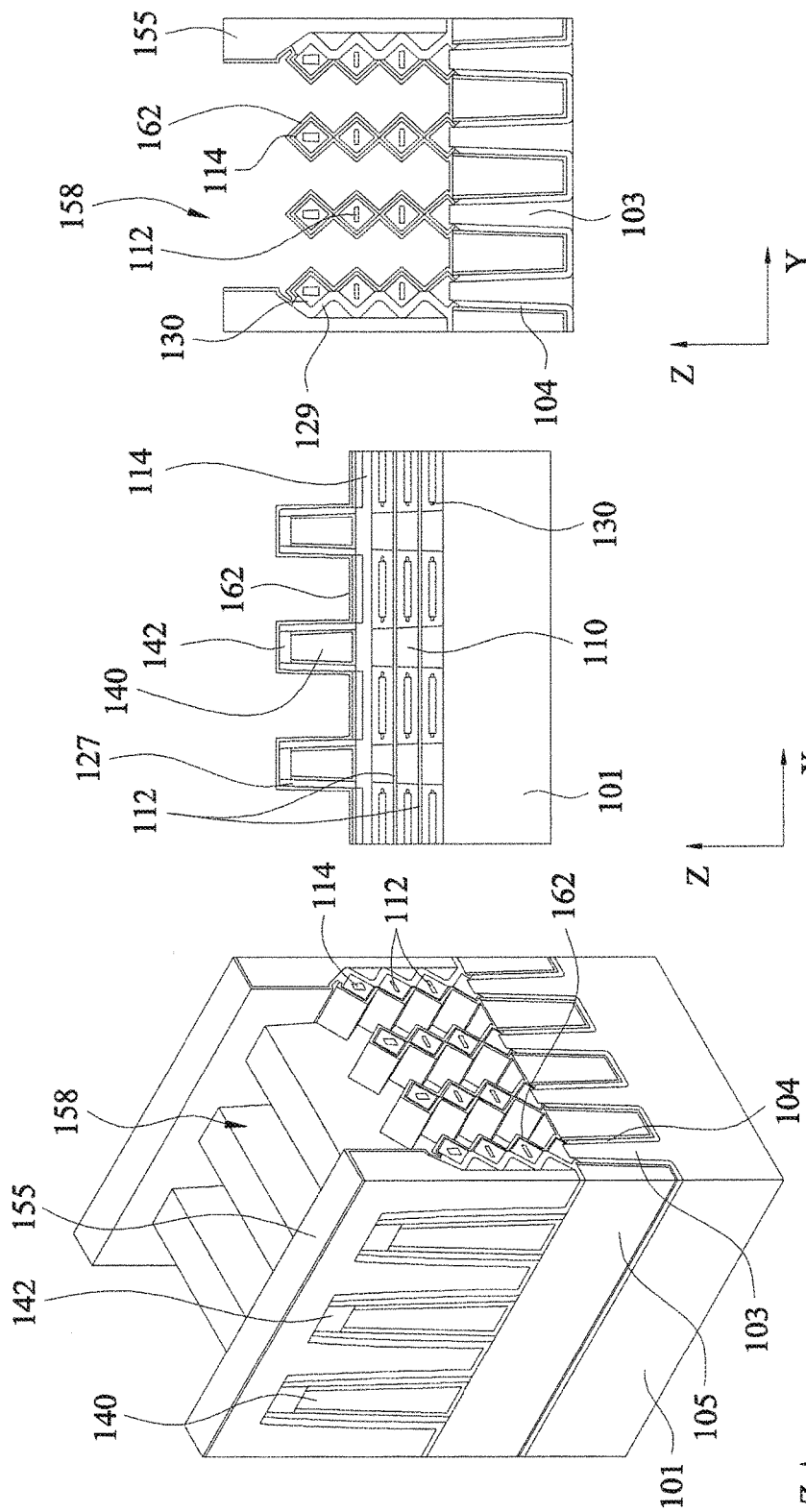
FIGS. 23A-23D illustrate one of the various process stages in a semiconductor device fabrication process according to some embodiments of the present disclosure.
Figure 23D:
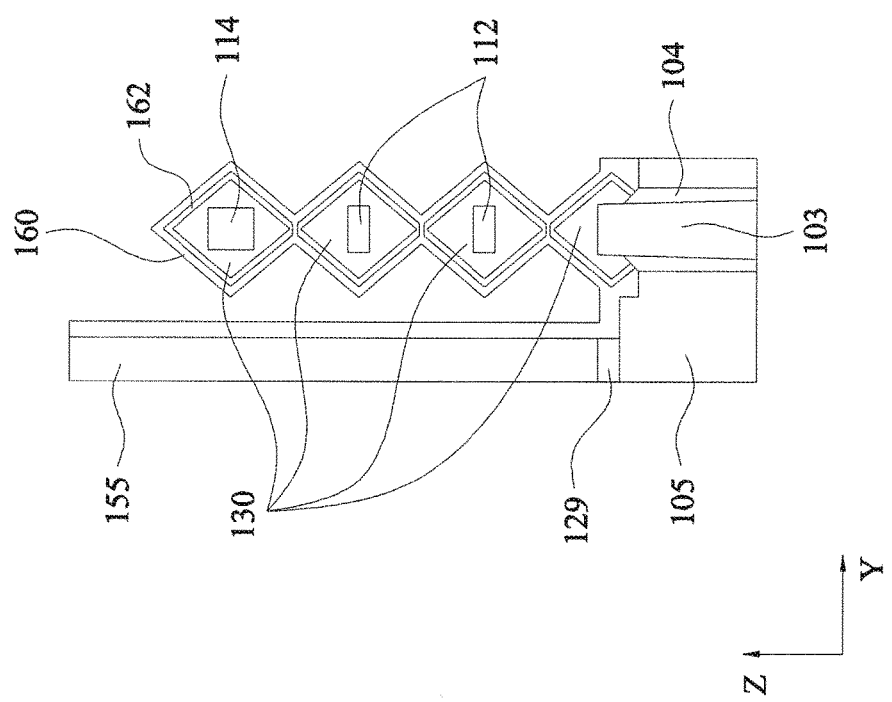

Referring to FIGS. 23A-23D, FIGS. 23A-23D illustrate one of the various stages for a FinFET manufacturing process according to embodiments of the present disclosure. FIG. 23D is an enlarged view of one fin structure of FIG. 23C.

By applying a heat, the metal layer 160 reacts with the S/D epitaxial layer 130, thereby forming a silicide layer 162 to reduce $R_c$ between the S/D structure and a contact metal formed thereafter. In some embodiments, the silicide layer 162 has a thickness between about 0.5 nm and about 10 nm.

In some embodiments, the metal layer 160 remains on the insulating material layers, such as the second ILD layer, the isolation insulating layer 105, sidewall spacers 127 and/or the gate cap layer 142. In certain embodiments, after the silicide layer 162 is formed, etching process is performed to remove the excess metal layer 160.

Referring to FIGS. 24A-24C, FIGS. 24A-24C illustrate one of the various stages for a FinFET manufacturing process according to embodiments of the present disclosure.

Subsequently, S/D contacts 165 are formed in the S/D contact openings 158 to contact the silicide layer 162 formed on the S/D epitaxial layers 130.

The S/D contacts 165 may include a single layer or a multi-layer structure. For example, in some embodiments, the S/D contact 165 includes a contact liner layer, such as a diffusion barrier layer, an adhesion layer, or the like, and a contact body formed over the contact liner layer in the contact openings 158. The contact liner layer may include Ti, TiN, Ta, TaN, or the like formed by ALD, CVD, or the like. The contact body may be formed by depositing a conductive material, such as one or more layers of Ni, Ta, TaN, W, Co, Ti, TiN, Al, Cu, Au, alloys thereof, combinations thereof, or the like, but other suitable metals may also be used. A planarization process, such as a CMP, may be performed to remove excess material from a surface of the second ILD layer 155 and the gate cap layer 142.

After forming the S/D contacts 165, further CMOS processes are performed to form various features such as additional interlayer dielectric layers, contacts/vias, interconnect metal layers, and passivation layers, etc.

FIGS. 25A-30B illustrate exemplary cross sectional views of the S/D regions of a fin field effect transistor (FinFET) according to some embodiments of the present disclosure.

In FIGS. 25A and 25B, after the S/D epitaxial layers 130 are formed, there is a gap/space between the adjacent S/D epitaxial layers. When the metal layer 160 is formed, the metal layer 160 fills the gap. After the silicide layer 162 is formed, part of the S/D epitaxial layers remains and there is an unreacted metal layer 160 on the silicide layer 162 and in the gap.

Figures 26A, 26B:
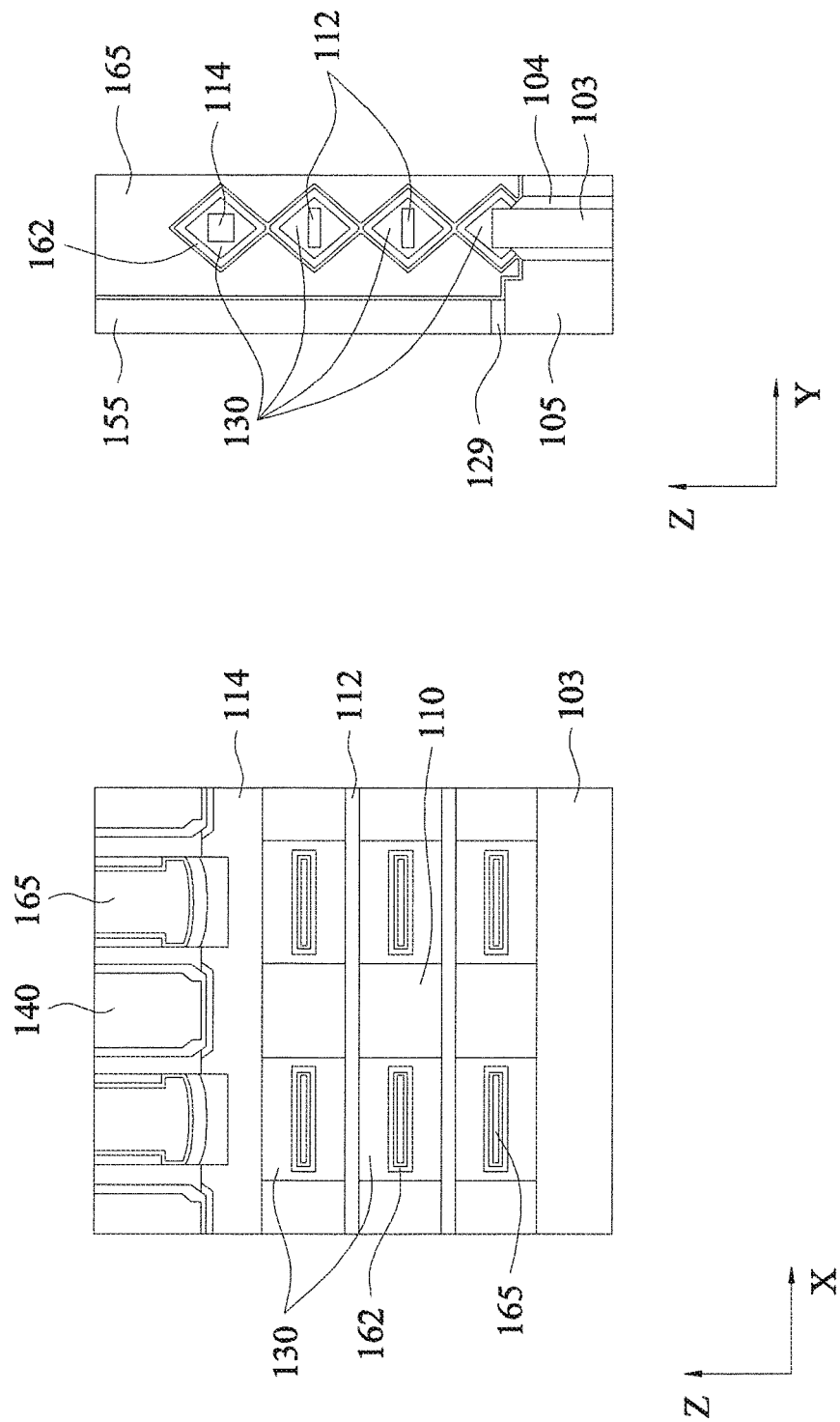
FIGS. 26A and 26B illustrate exemplary cross sectional views of a FinFET according to some embodiments of the present disclosure.

In FIGS. 26A and 26B, after the S/D epitaxial layers 130 are formed, there is a gap/space between the adjacent S/D epitaxial layers. After the metal layer 160 is formed, there still is the gap. After the silicide layer 162 is formed, part of the S/D epitaxial layers remains and substantially all metal layers 160 deposited on the S/D epitaxial layers 130 are consumed to form the silicide layer 162. The conductive material for the S/D contact 165 fills the gap.

Figure 27B:
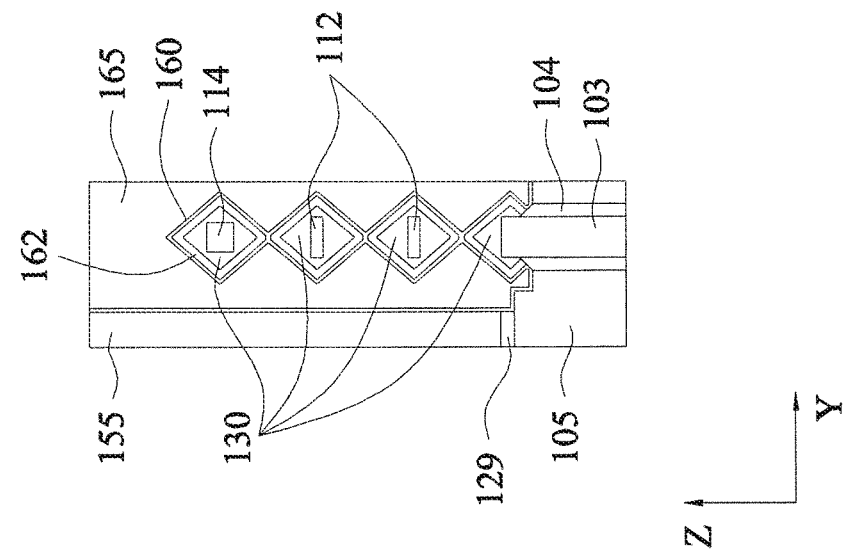
FIGS. 27A and 27B illustrate exemplary cross sectional views of a FinFET according to some embodiments of the present disclosure.
Figure 27A:
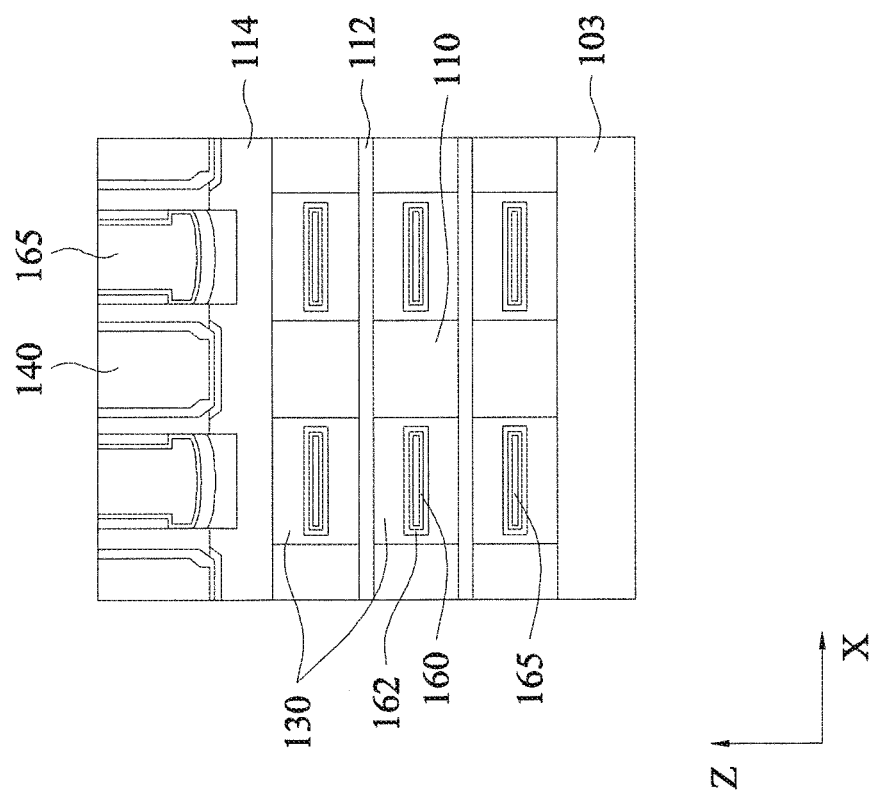

In FIGS. 27A and 27B, after the S/D epitaxial layers 130 are formed, there is a gap/space between the adjacent S/D epitaxial layers. After the metal layer 160 is formed, there still is the gap. After the silicide layer 162 is formed, part of the S/D epitaxial layers remains and there is an unreacted metal layer 160 on the silicide layer 162 and in the gap, but there still is the gap. The conductive material for the S/D contact 165 fills the gap.

Figures 28A, 28B:
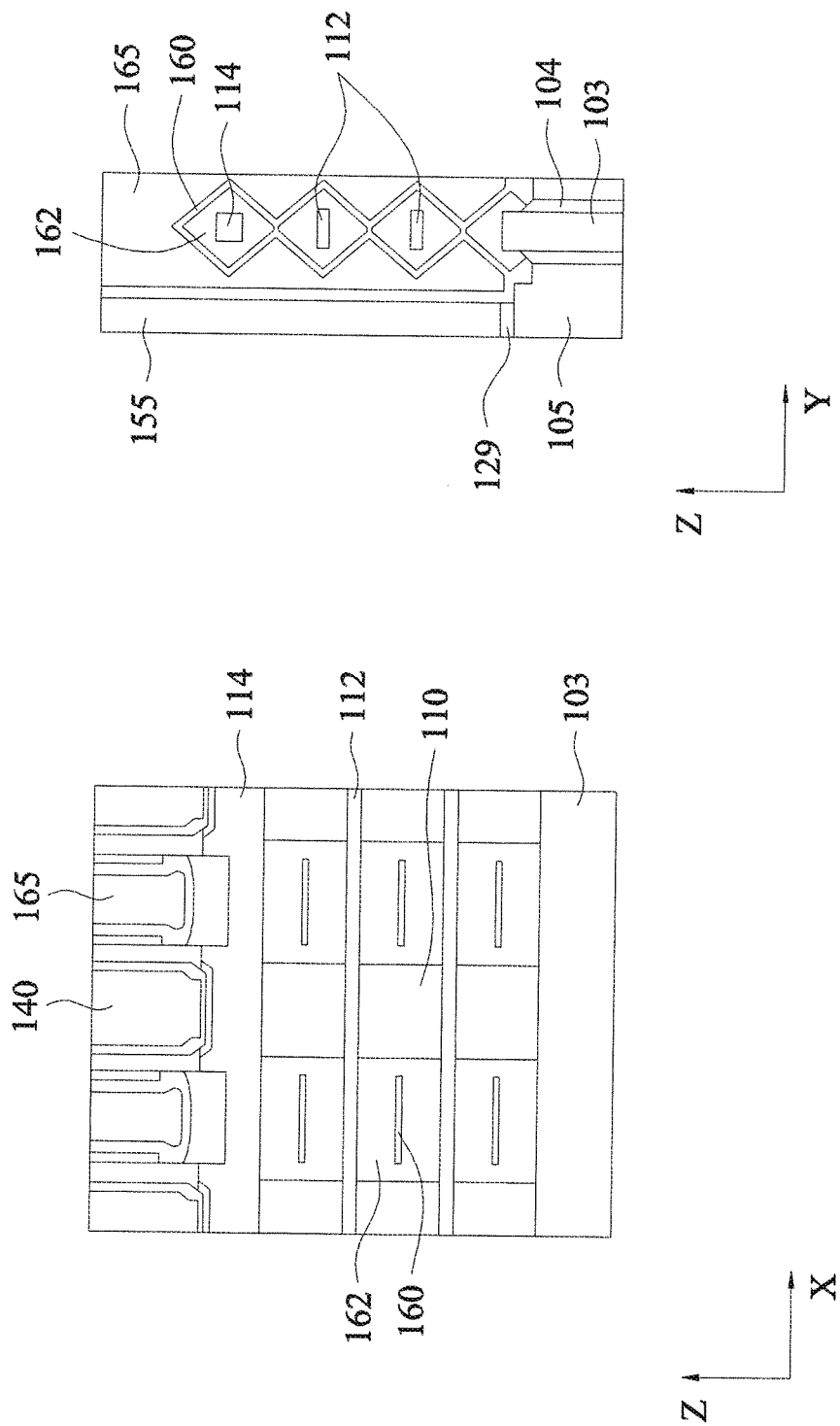
FIGS. 28A and 28B illustrate exemplary cross sectional views of a FinFET according to some embodiments of the present disclosure.

In FIGS. 28A and 28B, after the S/D epitaxial layers 130 are formed, there is a gap/space between the adjacent S/D epitaxial layers. When the metal layer 160 is formed, the metal layer 160 fills the gap. After the silicide layer 162 is formed, no part of the S/D epitaxial layers remains and there is an unreacted metal layer 160 on the silicide layer 162 and in the gap.

Figures 29A, 29B:
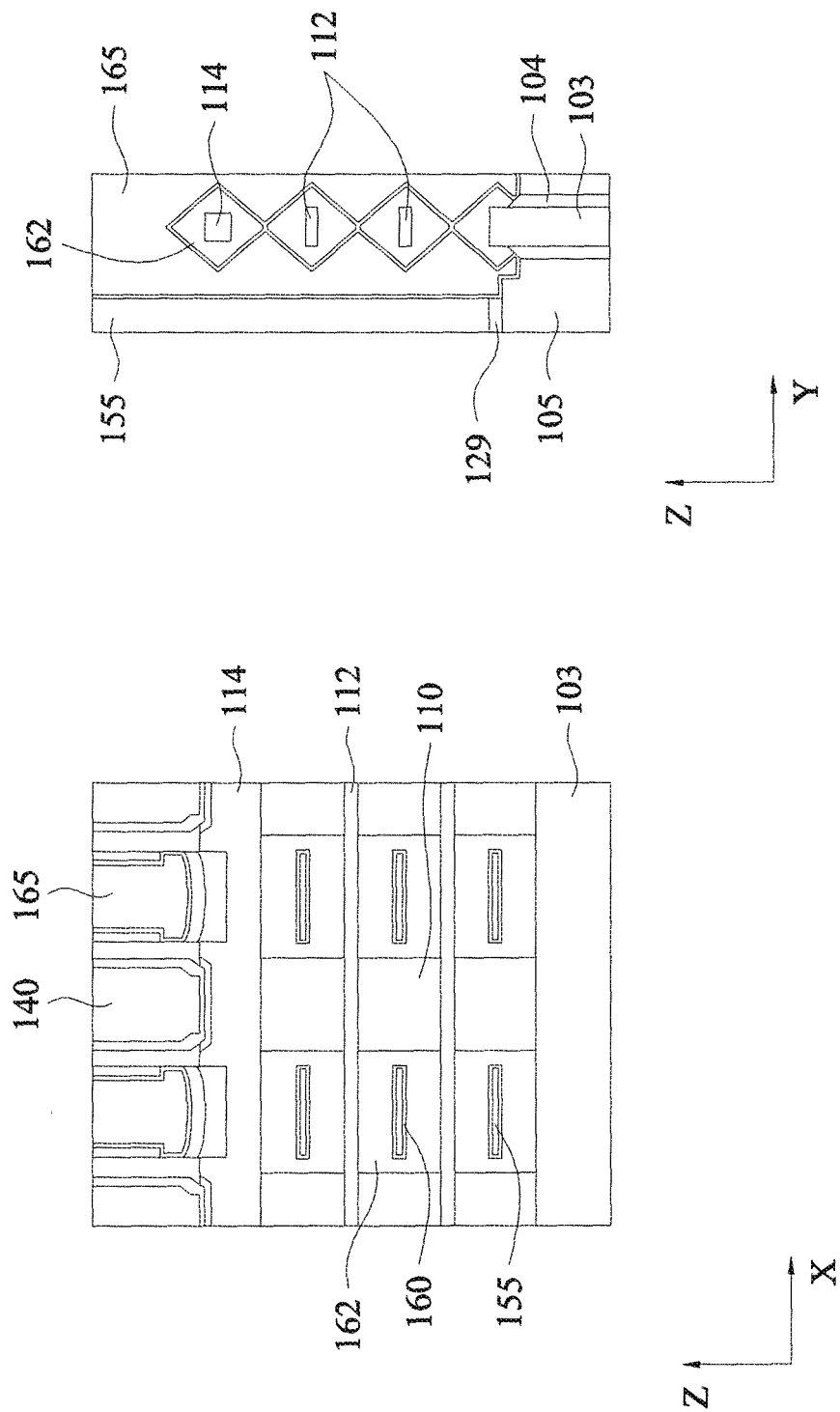
FIGS. 29A and 29B illustrate exemplary cross sectional views of a FinFET according to some embodiments of the present disclosure.

In FIGS. 29A and 29B, after the S/D epitaxial layers 130 are formed, there is a gap/space between the adjacent S/D epitaxial layers. After the metal layer 160 is formed, there still is the gap. After the silicide layer 162 is formed, no part of the S/D epitaxial layers remains and substantially all metal layers 160 deposited on the S/D epitaxial layers 130 are consumed to form the silicide layer 162. The conductive material for the S/D contact 165 fills the gap.

In FIGS. 30A and 30B, after the S/D epitaxial layers 130 are formed, there is a gap/space between the adjacent S/D epitaxial layers. After the metal layer 160 is formed, there still is the gap. After the silicide layer 162 is formed, no part of the S/D epitaxial layers remains and there is an unreacted metal layer 160 on the silicide layer 162 and in the gap, but there still is the gap. The conductive material for the S/D contact 165 fills the gap.

FIGS. 31A-31C illustrate exemplary views of a fin field effect transistor (FinFET) according to other embodiments of the present disclosure. In this embodiment, the structure is substantially the same as that of FIGS. 24A-24C, except that two pairs of the first semiconductor layer 110 and the second semiconductor layer 112, 114 are formed as the channel fin structure.

FIGS. 32A-36C illustrate various process stages in a semiconductor device fabrication process according to other embodiments of the present disclosure.

Throughout the various views and illustrative embodiments, like reference numbers are used to designate like elements. In FIGS. 32A-36C, the "A" figures (e.g., FIGS. 32A, 33A, etc.) illustrate a perspective view, the "B" figures (e.g., FIGS. 32B, 33B, etc.) illustrate a cross-sectional view along the gate direction (Y direction) cutting the space between gates, and the "C" figures (e.g., FIG. 32C, 33C, etc.) illustrate a cross-sectional view along the channel direction (the X direction). It is understood that additional operations can be provided before, during, and after processes shown by FIGS. 32A-36C, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 2A-24C may be employed in the following embodiments, and detailed explanation thereof may be omitted.

Figure 32C:
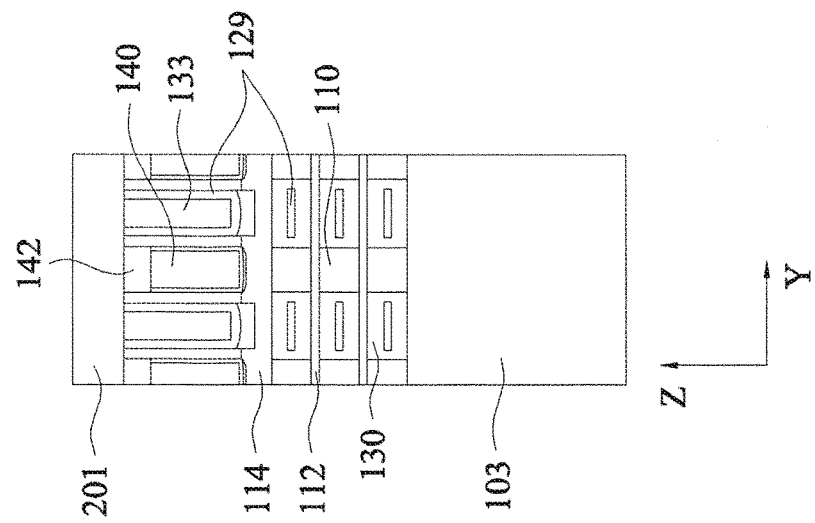
FIGS. 32A-32C illustrate one of the various process stages in a semiconductor device fabrication process according to some embodiments of the present disclosure.
Figure 32B:
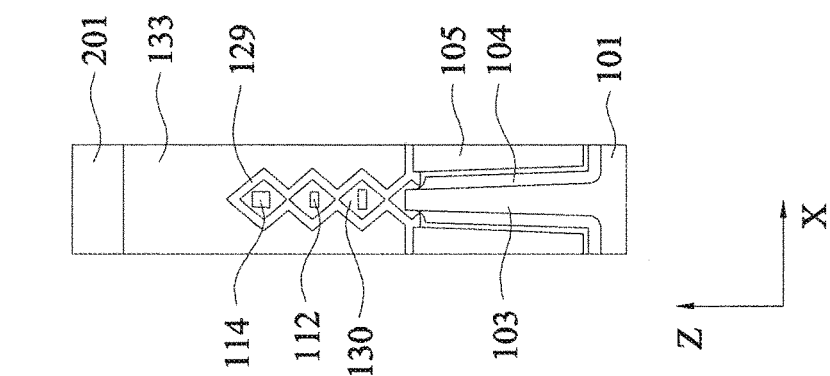
Figure 32A:
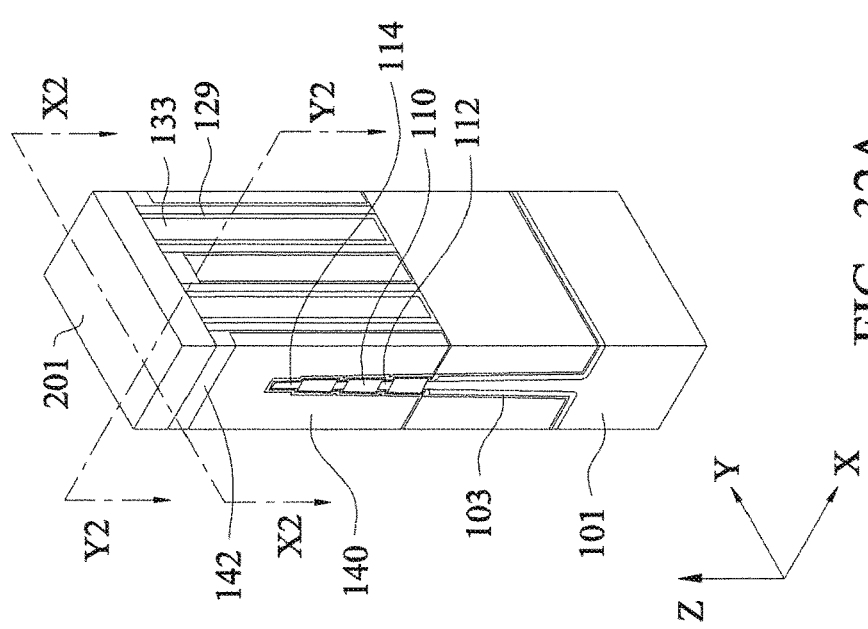

Referring to FIGS. 32A-32C, after the structure shown in FIGS. 13A-13C, a mask layer 201 is formed over the first ILD layer 133 and the gate structures. The mask layer 201 includes one or more layers of $SiO_2$, SiCN, SiON, SiN, $Al_2O_3$, $La_2O_3$, or the like, but other suitable dielectric films may be used. The mask layer 201 may be deposited by PVD, CVD, sputter deposition, or other techniques known and used in the art for depositing conductive materials.

Referring to FIGS. 33A-33C, the mask layer 201 is patterned by using a patterning operation, and by using the patterned mask layer 201 as an etching mask, the first ILD layer 133 and the CESL 129 are etched to form openings 203, in which the S/D epitaxial layers 130 are exposed.

Figures 34A, 34B, 34C:
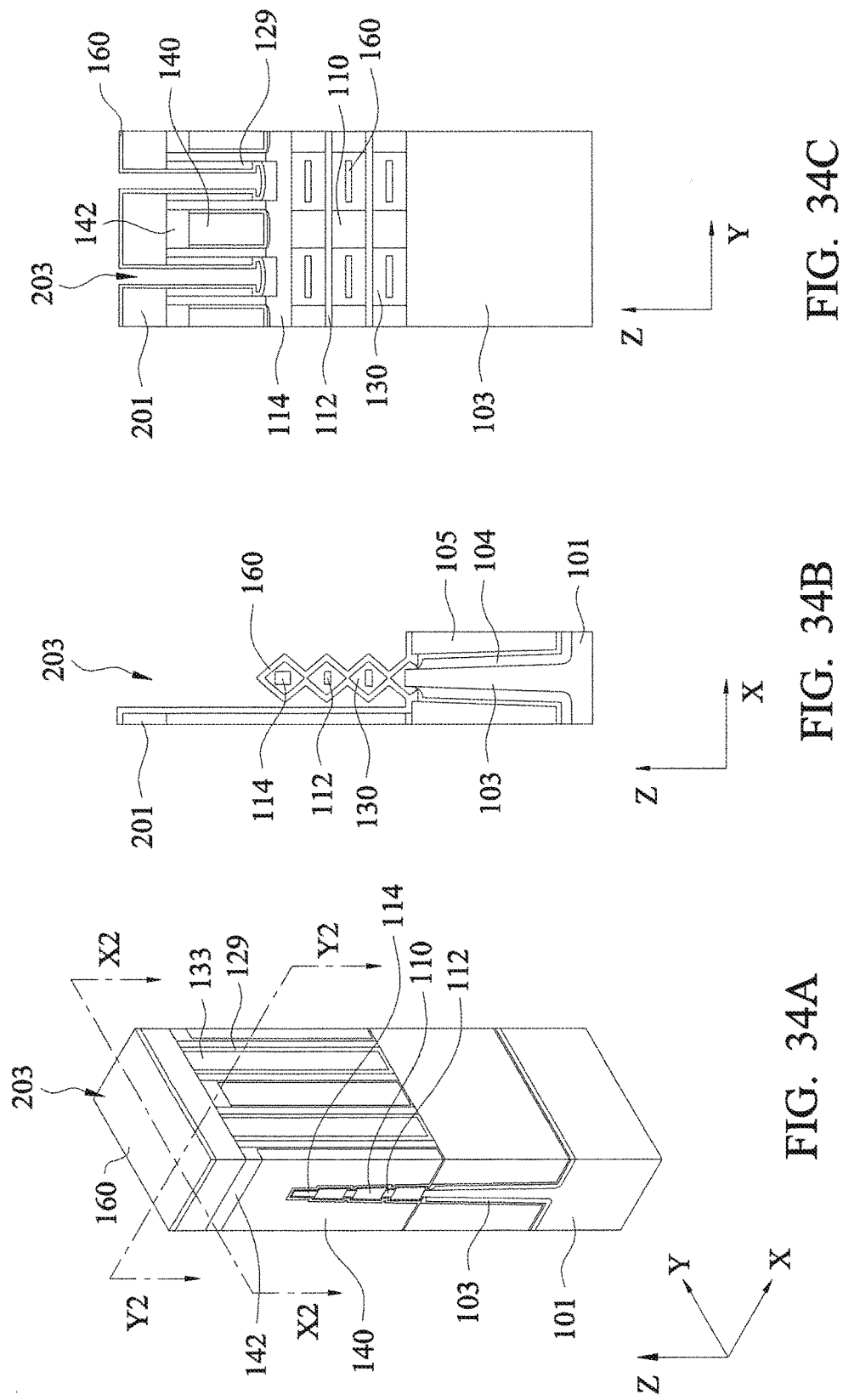
FIGS. 34A-34C illustrate one of the various process stages in a semiconductor device fabrication process according to some embodiments of the present disclosure.

Referring to FIGS. 34A-34C, after the S/D epitaxial layers 130 are exposed, a metal layer 160 for silicide formation is formed on the exposed S/D epitaxial layers 130. The metal layer 160 includes one or more of Ti, Ta, Ni Co and W. The thickness of the metal layer 160 is in a range from about 1 nm to about 10 nm in some embodiments. In certain embodiments, a cover layer made of TiN is further formed on the metal layer 160. In certain embodiments, the metal layer 160 is also formed on the sidewall of the first ILD 133 and the upper surface of the isolation insulating layer 105. The metal layer 160 and the cover layer may be formed using a suitable process such as ALD, CVD, PVD, plating, or combinations thereof.

Figures 35A, 35B, 35C:
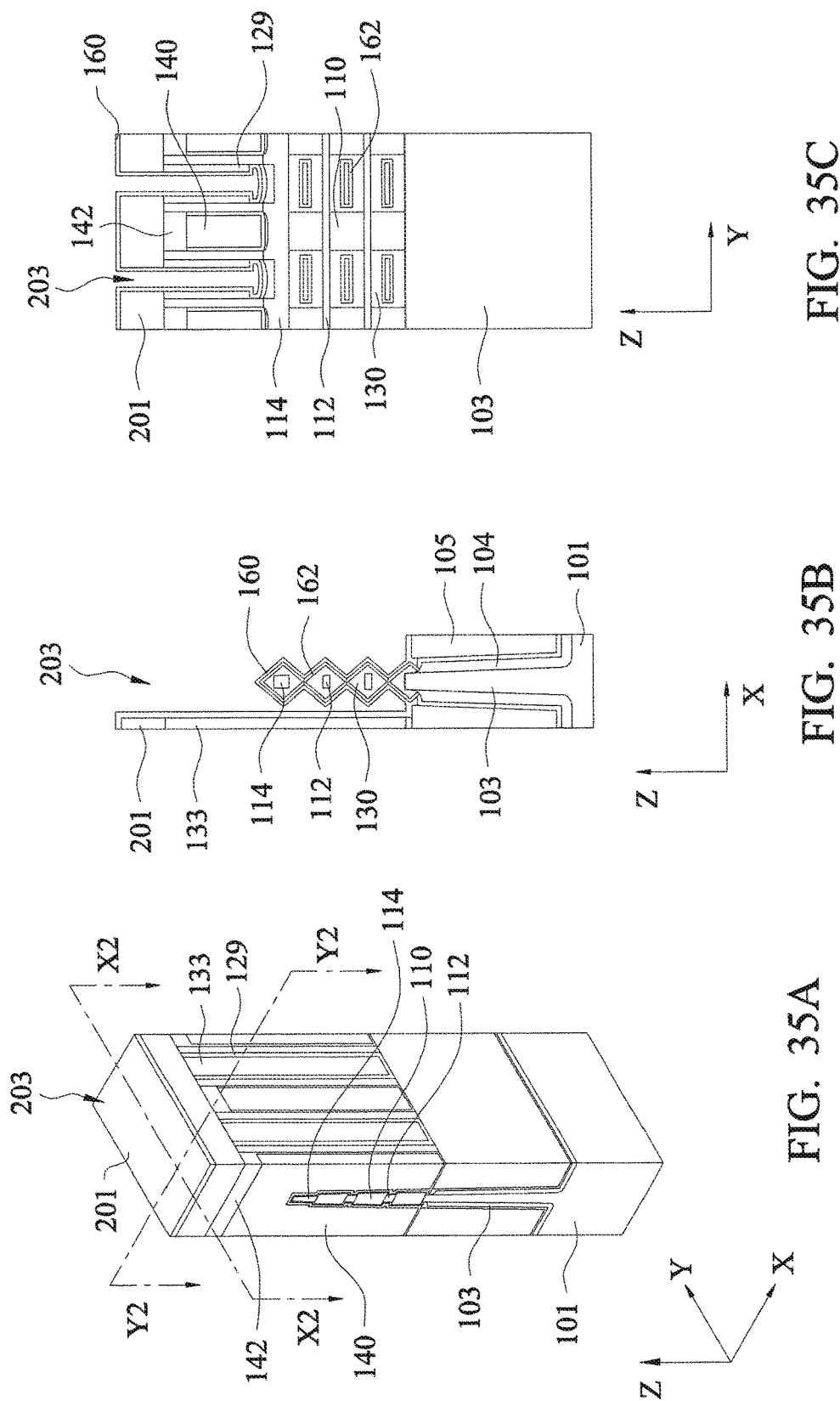
FIGS. 35A-35C illustrate one of the various process stages in a semiconductor device fabrication process according to some embodiments of the present disclosure.

Referring to FIGS. 35A-35C, by applying a heat, the metal layer 160 reacts with the S/D epitaxial layer 130, thereby forming a silicide layer 162. In some embodiments, the silicide layer 162 has a thickness between about 0.5 nm and about 10 nm.

In some embodiments, the metal layer 160 remains on the insulating material layers, such as the first ILD layer, the isolation insulating layer 105, sidewall spacers 127 and/or the gate cap layer 142. In certain embodiments, after the silicide layer 162 is formed, etching process is performed to remove the excess metal layer 160.

Referring to FIGS. 36A-36C, subsequently, S/D contacts 165 are formed in the S/D contact openings 203 to contact the silicide layer 162 formed on the S/D epitaxial layers 130.

The S/D contacts 165 may include a single layer or a multi-layer structure. For example, in some embodiments, the S/D contact 165 includes a contact liner layer, such as a diffusion barrier layer, an adhesion layer, or the like, and a contact body formed over the contact liner layer in the contact openings 203. The contact liner layer may include Ti, TiN, Ta, TaN, or the like formed by ALD, CVD, or the like. The contact body may be formed by depositing a conductive material, such as one or more layers of Ni, Ta, TaN, W, Co, Ti, TiN, Al, Cu, Au, alloys thereof, combinations thereof, or the like, but other suitable metals may also be used. A planarization process, such as a CMP, may be performed to remove excess material from a surface of the first ILD layer 133 and the gate cap layer 142.

After forming the S/D contacts 165, further CMOS processes are performed to form various features such as additional interlayer dielectric layers, contacts/vias, interconnect metal layers, and passivation layers, etc.

It will be understood that not all advantages have been necessarily discussed herein, no particular advantage is required for all embodiments or examples, and other embodiments or examples may offer different advantages.

For example, in the present disclosure, beam-like channel layers (e.g., second semiconductor layers 112, 114) are inserted within the main channel layers (e.g., first semiconductor layers 110) to maintain the channel strain and to increase the channel height of the main channel layers. Accordingly, it is possible to increase a channel current density and enhance a device performance. Further, since only the beam-like channel layers (e.g., second semiconductor layers 112, 114) extend into the S/D region, as a wire shape by selectively etching the main channel layers from the S/D region, it is possible to achieve an appropriate S/D proximity push etching with keeping the channel strain, and to obtain the metal-all-around structure in the SD contact. This metal contact structure can enlarge the contact landing area to reduce the contact resistance.

In accordance with an aspect of the present disclosure, a semiconductor device includes a fin field effect transistor (FinFET). The FinFET includes a channel disposed on a fin, a gate disposed over the channel, and a source and drain. The channel includes at least two pairs of a first semiconductor layer and a second semiconductor layer formed on the first semiconductor layer. The first semiconductor layer has a different lattice constant than the second semiconductor layer. A thickness of the first semiconductor layer is three to ten times a thickness of the second semiconductor layer at least in one pair.

In accordance with another aspect of the present disclosure, a semiconductor device includes a fin field effect transistor (FinFET). The FinFET includes a channel disposed on a fin, a gate disposed over the channel, and a source and drain. The channel includes a first semiconductor layer epitaxially formed on the fin, a second semiconductor layer epitaxially formed on the first semiconductor layer, a third semiconductor layer epitaxially formed on the second semiconductor layer, and a fourth semiconductor layer formed over the third semiconductor layer. The first and third semiconductor layers are made of a first semiconductor material. The second semiconductor layer is made of a second semiconductor material having a different lattice constant than the first semiconductor material. The thicknesses of the first and third semiconductor layers are three to ten times a thickness of the second semiconductor layer. The second semiconductor layer extends into the source and the drain and the first and third semiconductor layers do not extend into the source and the drain.

In accordance with another aspect of the present disclosure, in a method of forming a semiconductor device including fin field effect transistors (FinFETs), at least two pairs of a first semiconductor layer and a second semiconductor layer formed on the first semiconductor layer are formed on a substrate. The two pairs of the first and second semiconductor layers and the substrate are patterned, thereby forming a channel fin formed by part of the first and second semiconductor layers and a base fin formed by part of the substrate. A source and a drain are formed. A gate structure is formed over a channel layer formed by a part of the channel fin. The first semiconductor layer has a different lattice constant than the second semiconductor layer. A thickness of the first semiconductor layer is three to ten times a thickness of the second semiconductor layer at least in one pair.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a fin field effect transistor (FinFET), the FinFET comprising:
a channel disposed on a fin;
a gate disposed over the channel; and
a source and drain, wherein:
the channel includes at least two pairs of a first semiconductor layer and a second semiconductor layer formed on the first semiconductor layer,
the first semiconductor layer has a different lattice constant than the second semiconductor layer,
a thickness of the first semiconductor layer is three to ten times a thickness of the second semiconductor layer at least in one pair, and
at least in one pair, the second semiconductor extends into the source and the drain and the first semiconductor layer does not extend into the source and the drain.

2. The semiconductor device of claim 1, wherein the channel includes three pairs of the first semiconductor layer and the second semiconductor layer formed on the first semiconductor layer.

3. The semiconductor device of claim 1, wherein the second semiconductor layer is Si and the first semiconductor layer is $Si_{1-x}Ge_x$, where $0.1<x<0.9$.

4. The semiconductor device of claim 1, wherein the second semiconductor layer is Si and the first semiconductor layer is $Si_{1-x}Ge_x$, where $0.2<x<0.4$.

5. The semiconductor device of claim 4, wherein the thickness of the second semiconductor layer is 1 nm to 5 nm.

6. The semiconductor device of claim 5, wherein the thickness of the first semiconductor layer is 10 nm to 30 nm.

7. The semiconductor device of claim 1, wherein a thickness of the second semiconductor layer in an upper most pair is greater than a thickness of the second semiconductor layer in one or more remaining pairs.

8. The semiconductor device of claim 1, wherein the channel has a tapered shape having a bottom width greater than a top width.

9. The semiconductor device of claim 1, wherein the thickness of the first semiconductor layer in at least one pair is different from the thickness of the first semiconductor layer in one of more remaining pairs.

10. A semiconductor device including a fin field effect transistor (FinFET), the FinFET comprising:
a channel disposed on a fin;
a gate disposed over the channel; and
a source and drain, wherein:
the channel includes:
a first semiconductor layer epitaxially formed on the fin;
a second semiconductor layer epitaxially formed on the first semiconductor layer;
a third semiconductor layer epitaxially formed on the second semiconductor layer; and a fourth semiconductor layer formed over the third semiconductor layer, the first and third semiconductor layers are made of a first semiconductor material, the second semiconductor layer is made of a second semiconductor material having a different lattice constant than the first semiconductor material, thicknesses of the first and third semiconductor layers are three to ten times a thickness of the second semiconductor layer, and the second semiconductor layer extends into the source and the drain and the first and third semiconductor layers do not extend into the source and the drain.

11. The semiconductor device of claim 10, wherein the fourth semiconductor layer is made of the second semiconductor material.

12. The semiconductor device of claim 10, wherein a thickness of the fourth semiconductor layer is equal to or greater than the thickness of the second semiconductor layer and smaller than the thickness of the first and third semiconductor layers.

13. The semiconductor device of claim 10, wherein the first semiconductor material is $Si_{1-x}Ge_x$, and the second semiconductor material is $Si_{1-y}Ge_y$, where $0 \leq y < x < 1.0$.

14. The semiconductor device of claim 10, wherein an epitaxial source/drain layer is formed around part of the second semiconductor layer, which extends into the source and the drain.

15. The semiconductor device of claim 14, wherein a silicide layer is formed on the epitaxial source/drain layer.

16. The semiconductor device of claim 15, further comprising a source contact contacting the source, wherein:

the silicide layer wraps around the epitaxial source/drain layer, and the source contact wraps around the silicide layer.

17. The semiconductor device of claim 10, wherein:

the fourth semiconductor layer extends into the source and the drain, and epitaxial source/drain layers are formed around part of the second semiconductor layer and part of the fourth semiconductor layer, which extend into the source and the drain.

18. The semiconductor device of claim 10, wherein:

the channel further includes, between the third semiconductor layer and the fourth semiconductor layer:

a fifth semiconductor layer epitaxially formed on the third semiconductor layer; and a sixth semiconductor layer epitaxially formed on the fifth semiconductor layer, the fourth semiconductor layer is epitaxially formed on the sixth semiconductor layer, and a thickness of the sixth semiconductor layer is three to ten times the thickness of the second semiconductor layer and a thickness of the fifth semiconductor layer, and the fifth semiconductor layer extends into the source and the drain and the sixth semiconductor layer does not extend into the source and the drain.

19. The semiconductor device of claim 18, wherein a width of the third semiconductor layer is smaller than a width of the first semiconductor layer and greater than a width of the sixth semiconductor layer, in a channel direction.

20. A semiconductor device including a fin field effect transistor (FinFET), the FinFET comprising:

a channel disposed on a fin;

a gate disposed over the channel; and a source and drain, wherein:

the channel includes at least two pairs of a first semiconductor layer and a second semiconductor layer formed on the first semiconductor layer, the first semiconductor layer is made of a different material than the second semiconductor layer, a thickness of the first semiconductor layer is three to ten times a thickness of the second semiconductor layer at least in one pair, and a width of the first semiconductor layer in one of the at least two pairs is different from a width of the first semiconductor layer in another of the at least two pairs.

* * * * *